United States Patent
Ito et al.

(10) Patent No.: US 6,184,489 B1
(45) Date of Patent: Feb. 6, 2001

(54) PARTICLE-REMOVING APPARATUS FOR A SEMICONDUCTOR DEVICE MANUFACTURING APPARATUS AND METHOD OF REMOVING PARTICLES

(75) Inventors: Natsuko Ito; Fumihiko Uesugi; Tsuyoshi Moriya, all of Tokyo (JP)

(73) Assignee: NEC Corporation, Tokyo (JP)

(*) Notice: Under 35 U.S.C. 154(b), the term of this patent shall be extended for 0 days.

(21) Appl. No.: 09/290,636

(22) Filed: Apr. 12, 1999

(30) Foreign Application Priority Data

Apr. 13, 1998 (JP) .................................................. 10-101090

(51) Int. Cl.[7] .................................................... B23K 10/00
(52) U.S. Cl. .............................. 219/121.43; 219/121.41; 118/723 R; 204/298.11; 156/345
(58) Field of Search ........................... 219/121.4, 121.41, 219/121.43; 118/723 R, 723 I, 723 MW; 156/345, 646.1; 204/298.51, 298.37, 298.21, 298.11

(56) References Cited

U.S. PATENT DOCUMENTS

| | | | |
|---|---|---|---|
| 3,984,301 | * 10/1976 | Matsuzaki et al. | 156/345 |
| 4,584,045 | * 4/1986 | Richards | 156/643.1 |
| 4,718,975 | * 1/1988 | Bowling et al. | 156/345 |

FOREIGN PATENT DOCUMENTS

| | | |
|---|---|---|
| 5-29272 | 2/1993 | (JP) . |
| 7-58033 | 3/1995 | (JP) . |
| 8-107102 | 4/1996 | (JP) . |
| 8-148436 | 6/1996 | (JP) . |

\* cited by examiner

Primary Examiner—Mark Paschall
(74) Attorney, Agent, or Firm—Hutchinson, Wheeler & Dittmar

(57) ABSTRACT

In a semiconductor device manufacturing apparatus that processing a substrate by applying a voltage to a gas to create a plasma, positively charged particles are trapped or guided at the instant that the cathode voltage is stopped, by an electrode to which is imparted a negative voltage, so as to prevent particles reaching the substrate.

13 Claims, 23 Drawing Sheets

(a)

(a)

(a)

(a)

(b)

a : HIGH-FREQUENCY VOLTAGE
b : PROCESSING CHAMBER PRESSURE
c : PROCESSING GAS FLOW
d : ELECTROSTATIC CHUCK VOLTAGE
e : TRANSPORTING PORT OPEN/CLOSE (a)

PARTICLE-REMOVING APPARATUS FOR A SEMICONDUCTOR DEVICE MANUFACTURING APPARATUS AND METHOD OF REMOVING PARTICLES

BACKGROUND OF THE INVENTION

1. Field of the Invention

The present invention relates to a particle-removing apparatus for a semiconductor device manufacturing apparatus and to a method of removing particles, and more specifically it relates to a particle-removing apparatus that prevents the falling of particles that are generated during a process onto a wafer, and to a method for removing particles.

2. Description of the Related Art

Particles that are generated in the process of manufacturing a semiconductor device, and in particular in a process that makes use of plasma, are a cause of reduced yield and a deterioration of uptime. These particles can be caused by the peeling off of substances that have been deposited within the process equipment by reactions and by growth of substances generated by reaction within the plasma. To prevent the falling of these particles onto a substrate, as described in the Japanese Unexamined Patent Publications (KOKAI) No. 5-29272 and No. 7-58033, there has been a proposal of an apparatus in which the substrate is covered after a process is completed.

FIG. 9(a) is a drawing that shows a plasma etching apparatus of the past, in which the reference numeral 2100 denotes a processing chamber, inside which are provided an upper processing electrode 2200 and a lower processing electrode 2300, the upper processing electrode 2200 being grounded, and a high-frequency power supply 2400 being connected to the lower processing electrode 2300.

Above the lower processing electrode 2300 there is provided an electrostatic chuck electrode 2700, which is insulated by means of an insulator 1900, a voltage being applied to this electrostatic chuck electrode 2700 from a power supply 2600, so as to hold a semiconductor substrate 3000. The processing chamber 2100 is provided with an intake port 3100 for processing gas and an exhaust port 3200. A cover 3600 is provided so that particles do not fall onto the semiconductor substrate 3000.

FIG. 9(b) illustrates the general equipment operation cycle of a plasma etching process in a semiconductor device manufacturing process.

This process is for the case of a cycle in which a single substrate is processed. The substrate 3000, which is transported from a transporting port 3800, is transported to within the processing chamber 2100, at which point the process gas is introduced from the process gas intake port 3100. When the pressure within the processing chamber 2100 reaches a prescribed value, a high-frequency voltage is applied from the power supply 2400, so as to generated a plasma that etches the substrate 3000. Simultaneously with the above, the substrate 3000 is held by the electrostatic chuck. After completion of the etching, the supply of the high-frequency voltage, the supply of the process gas, and the electrostatic chuck are all stopped. After several seconds, an inert gas that does not contribute to etching is supplied for a prescribed amount of time in order to quickly purge the chamber of the process gas. The substrate 3000, after completion of this processing, is transported to outside the processing chamber 2100 from the transporting port 3800.

In an apparatus of the past as described above, in order to prevent particles from falling onto the substrate 3000, the cover 3600 is provided over the substrate 3000. According to an experiment by the inventor, however, in a semiconductor device manufacturing process that uses plasma, the timing of the falling of particles onto a substrate was shown to be intimately connected with the operating status of the semiconductor device manufacturing apparatus. Specifically, in the above-noted publications of the past, there was absolutely no consideration given to the timing of the covering of the substrate, this representing a major problem with regard to not being able to prevent the attachment of particles to the substrate.

Accordingly, it is an object of the present invention to improve over the above-noted drawback in the prior art, in particular by providing a novel particle-removing apparatus of a semiconductor device manufacturing apparatus and a method of removing particles whereby, by controlling the timing of the covering by a cover provided over the substrate in accordance with the processing condition of the substrate, the attachment of particles that are generated within the manufacturing apparatus during a process that uses plasma to the substrate is prevented.

It is another object of the present invention to provide novel particle-removing apparatus of a semiconductor device particle and method of removing particles whereby, by making use of the characteristic that particles are positively charged, attachment of the particles to the substrate is prevented without the use of a cover or the like.

SUMMARY OF THE INVENTION

In order to achieve the above-noted object, the present invention adopts the following basic technical constitution.

Specifically, a first aspect of a particle-removing apparatus of a semiconductor device manufacturing apparatus according to the present invention is a particle-removing apparatus in which a high-frequency voltage is applied between an upper electrode and a lower electrode so as to generate a plasma within a processing chamber that processes a substrate located in the processing chamber, in which is provided a cover that covers the substrate, the substrate being covered by closing this cover, so as to prevent the attachment of particles within the processing chamber to the substrate, this particle-removing apparatus being provided with a first control means for controlling the timing of the drive of the above-noted cover, this control means performing control so as to change the cover from the opened condition to the closed condition immediately before stopping the application of the high-frequency voltage.

In a second aspect of a particle-removing apparatus according to the present invention, control is performed so as to change the above-noted cover from the closed condition to the opened condition in synchronization with a tranport operation of a substrate- transporting apparatus that is provided in the semiconductor device manufacturing apparatus.

In a third aspect of a particle-removing apparatus according to the present invention, the timing of control of changing the cover from the closed condition to the opened condition is immediately before transporting the substrate after completion of processing to outside the processing chamber.

In a fourth aspect of a particle-removing apparatus according to the present invention, the timing of control of changing the cover from the closed condition to the opened condition is immediately after transporting the substrate after completion of processing to outside the processing chamber.

In a fifth aspect of a particle-removing apparatus according to the present invention, the timing of the control of changing the cover from the closed condition to the opened condition is immediately before the application of the high-frequency voltage.

In a sixth aspect of a particle-removing apparatus according to the present invention, in addition to imparting a potential to the above-noted cover, a second control means, for controlling the timing of application of the potential to the cover, is provided, this second control means performing control so that the potential is imparted to the cover minimally from immediately before the stopping of application of the high-frequency voltage to several seconds after the starting of introduction of a purging gas.

In a seventh aspect of a particle-removing apparatus according to the present invention, the above-noted potential is imparted minimally until immediately before the introduction of the purging gas.

In an eighth aspect of a particle-removing apparatus according to the present invention, the above-noted potential is imparted until the time at which the substrate is transported to outside the processing chamber.

In a ninth aspect of a particle-removing apparatus according to the present invention, the above-noted potential either is equivalent to a self-bias potential that appears on the lower electrode of the processing electrodes or has the same polarity as and a larger absolute value than the above-noted self-bias potential.

In a tenth aspect of a particle-removing apparatus according to the present invention, the above-noted potential is a potential that is equivalent to the potential on the lower electrode of the processing electrodes.

A first aspect of a particle-removing method according to the present invention is a particle-removing method in a semiconductor device manufacturing apparatus in which a high-frequency voltage is applied between an upper electrode and a lower electrode so as to generate a plasma within a processing chamber that processes a substrate located in the processing chamber, in which is provided a cover that covers the substrate, the substrate being covered by closing this cover, so as to prevent the attachment of particles within the processing chamber to the substrate, this particle-removing method performing control so as to change the cover from the opened condition to the closed condition immediately before stopping the application of the high-frequency voltage.

In a second aspect of a particle-removing method according to the present invention, control is performed so as to change the above-noted cover from the closed condition to the opened condition in synchronization with a transport operation of a substrate transport apparatus that is provided in the semiconductor device manufacturing apparatus.

A third aspect of a particle-removing method according to the present invention is a particle-removing method apparatus in a semiconductor device manufacturing apparatus in which a high-frequency voltage is applied between an upper electrode and a lower electrode so as to generate a plasma within a processing chamber that processes a substrate located in the processing chamber, in which is provided a cover that covers the substrate, the substrate being covered by closing this cover, so as to prevent the attachment of particles within the processing chamber to the substrate, this particle-removing method having a first step of changing the cover from the opened condition to the closed condition, a second step of stopping the application of the high-frequency voltage immediately after the cover is placed in the closed condition, and a third step of imparting a potential to the above-noted cover.

An eleventh aspect of a particle-removing apparatus of a semiconductor device manufacturing apparatus according to the present invention is a particle-removing apparatus in a semiconductor device manufacturing apparatus that has an etching processing chamber, a pair of processing electrodes formed by an upper electrode and a lower electrode, which are installed within the processing chamber, and a susceptor that holds a substrate to be processed onto the top of the above-noted lower electrode, a processing gas being introduced into the etching processing chamber and a prescribed voltage being applied to the above-noted processing electrodes, so as to generate a plasma thereof, thereby processing the substrate on the above-noted susceptor, this particle-removing apparatus being provided with a particle-removing electrode for the purpose of removing particles inside the processing chamber, a negative voltage being applied to this particle-removing electrode, thereby causing removal of charged particles in the processing chamber.

In a twelfth aspect of a particle-removing apparatus according to the present invention, the above-noted particle-removing electrode is provided between the upper electrode and the lower electrode.

In a thirteenth aspect of a particle-removing apparatus according to the present invention, an exhaust port is provided on a side wall of the etching processing chamber in the region in which the particle-removing electrode is provided.

In a fourteenth aspect of a particle-removing apparatus according to the present invention, the particle-removing electrode is provided over the above-noted lower electrode, in a manner so as to surround the substrate.

In a fifteenth aspect of a particle-removing apparatus according to the present invention, the particle-removing electrode is provided between the processing electrodes and a processing chamber side wall.

In a sixteenth aspect of a particle-removing apparatus according to the present invention, the particle-removing electrode is an attachment-preventing plate that prevents attachment of sediments onto a wall surface of the processing chamber.

In a seventeenth aspect of a particle-removing apparatus according to the present invention, the particle-removing electrode is provided either within a gas intake or in the region of a gas exhaust port of the etching processing chamber.

An eighteenth aspect of a particle-removing apparatus of a semiconductor device manufacturing apparatus according to the present invention is a particle-removing apparatus in a semiconductor device manufacturing apparatus that has an etching processing chamber, a pair of processing electrodes formed by an upper electrode and a lower electrode, which are installed within the processing chamber, and a susceptor that holds a substrate to be processed onto the top of the above-noted lower electrode, a processing gas being introduced into the etching processing chamber and a prescribed voltage being applied to the above-noted processing electrodes, so as to generate a plasma of the gas, thereby processing the substrate on the susceptor, this particle-removing apparatus having a gas exhaust port of the processing chamber that is formed by an electrically conductive material, to which a negative voltage is applied so as to remove charged particles from within the processing chamber.

A nineteenth aspect of a particle-removing apparatus of a semiconductor device manufacturing apparatus according to the present invention is a particle-removing apparatus in a semiconductor device manufacturing apparatus that has an etching processing chamber, a pair of processing electrodes formed by an upper electrode and a lower electrode, which are installed within the processing chamber, and a susceptor that holds a substrate to be processed onto the top of the above-noted lower electrode, a processing gas being introduced into the etching processing chamber and a prescribed voltage being applied to the above-noted processing electrodes, so as to generate a plasma of the gas, thereby processing the substrate on the susceptor, this particle-removing apparatus being provided, between the upper electrode and the lower electrode, with an electrically conductive grid-configured material for the purpose of removing particles, a negative voltage being applied to the grid-configured material, so as to remove charged particles from within the processing chamber.

A twentieth aspect of a particle-removing apparatus of a semiconductor device manufacturing apparatus according to the present invention is a particle-removing apparatus in a semiconductor device manufacturing apparatus that has an etching processing chamber, a pair of processing electrodes formed by an upper electrode and a lower electrode, which are installed within the processing chamber, and a susceptor that holds a substrate to be processed onto the top of the above-noted lower electrode, a processing gas being introduced into the etching processing chamber and a prescribed voltage being applied to the above-noted processing electrodes, so as to generate a plasma of the gas, thereby processing the substrate on the susceptor, this particle-removing apparatus being provided, in the region of substrate, with a particle-removing electrode for the purpose of removing particles, a negative voltage having an absolute value that is greater than the self-bias voltage of the above-noted lower electrode being applied to this particle-removing electrode, so as to prevent the falling of particles within the processing chamber onto the substrate.

A twenty-first aspect of a particle-removing apparatus of a semiconductor device manufacturing apparatus according to the present invention is a particle-removing apparatus in a semiconductor device manufacturing apparatus that has an etching processing chamber, a pair of processing electrodes formed by an upper electrode and a lower electrode, which are installed within the processing chamber, and a susceptor that holds a substrate to be processed onto the top of the above-noted lower electrode, a processing gas being introduced into the etching processing chamber and a prescribed voltage being applied to the above-noted processing electrodes, so as to generate a plasma of the gas, thereby processing the substrate on the susceptor, a prescribed bias being added to the voltage that is applied to the lower electrode, this being varied in the same manner as the self-bias voltage, thereby causing charged particles to be directed toward the lower electrode, so as to prevent these particles from falling onto the above-noted substrate.

In a twenty-second aspect of a particle-removing apparatus according to the present invention, a laser apparatus is provided for the purpose of detecting the occurrence of the above-noted particles, light from this laser apparatus being shined in an area surrounding the above-noted upper electrode so as to detect the presence of particles inside the processing chamber, and a third control means being further provided for the purpose of applying a negative voltage to the particle-removing electrode, based on the results of this detection.

A twenty-third aspect of a particle-removing apparatus of a semiconductor device manufacturing apparatus according to the present invention is a particle-removing apparatus in a semiconductor device manufacturing apparatus that has an etching processing chamber, a pair of processing electrodes formed by an upper electrode and a lower electrode, which are installed within the processing chamber, and a susceptor that holds a substrate to be processed onto the top of the above-noted lower electrode, a processing gas being introduced into the etching processing chamber and a prescribed voltage being applied to the above-noted processing electrodes, so as to generate a plasma thereof, thereby processing the substrate on the above-noted susceptor, this particle-removing apparatus being provided with a electrically conductive planar particle-removing electrode for the purpose of removing particles inside the processing chamber, a negative voltage being applied to this particle-removing electrode, thereby causing removal of charged particles in the processing chamber.

In a twenty-fourth aspect of a particle-removing apparatus according to the present invention, the above-noted particle-removing electrode is in the form of a grid-configured electrically conductive electrode. In a twenty-fifth aspect of a particle-removing apparatus according to the present invention, the above-noted negative voltage is applied after the completion of etching.

In a twenty-sixth aspect of a particle-removing apparatus according to the present invention, the above-noted negative voltage is applied during transport of the substrate.

A fourth aspect of a particle-removing method of a semiconductor device manufacturing apparatus according to the present invention is a particle-removing method for a semiconductor device manufacturing apparatus that has an etching processing chamber, a pair of processing electrodes formed by an upper electrode and a lower electrode, which are installed within the processing chamber, and a susceptor that holds a substrate to be processed onto the top of the above-noted lower electrode, a processing gas being introduced into the etching processing chamber, a prescribed voltage being applied to the above-noted processing electrodes, so as to generate a plasma of the gas, thereby processing the substrate on the susceptor, and a particle-removing electrode for the purpose of removing particles being provided inside the processing chamber, whereby, after completion of the etching of the substrate, a negative voltage is applied to the particle-removing electrode, so that charged particles inside the processing chamber are guided to this particle-removing electrode and caused to be attached to the particle-removing electrode, thereby preventing the particles from becoming attached to the substrate.

In a fifth aspect of a particle-removing method according to the present invention, after the application of the negative voltage to the particle-removing electrode, the etching gas in the processing chamber is exhausted.

A sixth aspect of a particle-removing method of a semiconductor device manufacturing apparatus according to the present invention is a particle-removing method for a semiconductor device manufacturing apparatus that has an etching processing chamber, a pair of processing electrodes formed by an upper electrode and a lower electrode, which are installed within the processing chamber, and a susceptor that holds a substrate to be processed onto the top of the above-noted lower electrode, a processing gas being introduced into the etching processing chamber, and a prescribed voltage being applied to the above-noted processing electrodes, so as to generate a plasma of the gas, thereby processing the substrate on the susceptor, wherein a gas exhaust port of the processing chamber is formed of an electrically conductive material, and a negative voltage is applied to this exhaust port, so as to guide charged particles toward the gas exhaust port and simultaneously exhaust the etching gas from within the processing chamber.

An seventh aspect of a particle-removing method of a semiconductor device manufacturing apparatus according to the present invention is a particle-removing method for a semiconductor device manufacturing apparatus that has an etching processing chamber, a pair of processing electrodes formed by an upper electrode and a lower electrode, which are installed within the processing chamber, and a susceptor that holds a substrate to be processed onto the top of the above-noted lower electrode, a processing gas being introduced into the etching processing chamber, and a prescribed voltage being applied to the above-noted processing electrodes, so as to generate a plasma of the gas, thereby processing the substrate on the susceptor, wherein by causing the size of the generated plasma to greatly extend beyond the substrate, particles inside the processing chamber are caused to fall along the periphery of the plasma, so that they are prevented from becoming attached to the substrate.

A particle-removing apparatus for a semiconductor device manufacturing apparatus according to the present invention is a particle-removing apparatus for a semiconductor device manufacturing apparatus in which a high-frequency voltage is applied between an upper electrode and a lower electrode to cause a plasma within the processing chamber so as to process a substrate therewithin, a cover that covers the substrate being provided, the substrate being covered by changing cover to the closed condition, so as to prevent particles within the processing chamber from becoming attached to the substrate, and a first control means that controls the timing of the drive timing of the cover being also provided, this first control means performing control so that the cover is changed from the opened condition to the closed condition immediately before stopping the application of the above-noted high-frequency voltage applied between an upper electrode and a lower electrode, and so that the cover is changed from the closed condition to the opened condition in synchronization with a transporting operation of a substrate transport apparatus provided in the semiconductor device manufacturing apparatus.

Therefore, by driving the cover so as to cover the substrate immediately before particles are generated, the attachment of the particles to the substrate is prevented.

Additionally, by imparting an appropriate potential to the cover, the cover has a dust-collecting action, enabling even more effective prevention of attachment of the particles to the substrate.

Next, yet another aspect of an embodiment of the present invention will be described.

FIG. 21 is a photograph of the behavior of particles in a plasma, inserted into a schematic representation of the apparatus. The right edge of the drawing corresponds to the region at the center of the process apparatus, and the left edge corresponds to the region of the wall of the process apparatus.

Particles are trapped in a sheath region in proximity to the upper electrode as shown in FIG. 21 and, at the instant the plasma collapses, so that the particles in the region of the upper electrode fly toward the outer walls by the potential of the afterglow plasma. In the center part of the chamber, however, the particles fall downward around the outside of the plasma, and in the region of the lower electrode, this being the region of the wafer, it can be seen that the negative self-bias potential causes the particles to fly towards the wafer.

From the above-noted results, the particles are seen to be positively charged, and the basis of the present invention is the use of this fact to remove the particles using electrostatic induction.

FIG. 9(b) shows an example of the relationship between the number of particles that are generated in the etching apparatus during operation, and the operation condition of the apparatus at that time.

The apparatus that is shown in FIG. 9(a) is an etching apparatus of the past that has flat parallel processing electrodes.

FIG. 9(b) is a representation of a cycle of processing one substrate. When the substrate is transported to inside the processing chamber from the transporting port, the processing gas is supplied and, when the pressure within the processing chamber reaches a prescribed value, a high-frequency voltage is applied, so as to generate a plasma, thereby causing etching of the substrate. When this is done, the substrate is held by the susceptor on the top of the lower electrode.

After completion of the above-noted etching, the supply of the high-frequency voltage, the supply of the process gas, and the electrostatic chucking are all stopped. After several seconds, an inert gas that does not contribute to etching is supplied for a prescribed amount of time in order to quickly purge the chamber of the process gas, this causing the pressure within the processing chamber to rise.

The substrate, after completion of this processing, is transported to outside the processing chamber from the transporting port. In the drawing, the number of particles P represented by the ellipses is the result of introducing the light from a laser into the region over the substrate in the processing chamber, and using a CCD camera to photograph the light scattered by particles that traverse this laser light, a signal that indicates the operating condition of the etching apparatus being simultaneously captured. The number shown is the accumulated number obtained from the processing of 25 substrates.

From FIG. 9(b), it is clear that the occurrence of particles P during etching corresponds to the operating condition of the apparatus. That is, while there is almost no particle generation during etching, when the etching is completed, there is a time when a large number of particles are generated, and the frequency of generation of particles is high when the purging gas is introduced.

A detailed examination of the images obtained from the light scattered by the particles revealed that the traces of particles at the time of the completion of the etching exhibit a tendency to be directed toward the substrate, and a tendency to be directed toward the exhaust port when the purging gas is introduced.

From the above, it can be envisioned that because the high-frequency power supply is stopped when the etching is completed, particles that float during etching fall and, because the viscous flow of the processing gas is small, the particles fly toward the substrate, on which all of its electrical charge have not been removed.

It is further envisioned, however, that several seconds after the completion of etching, purging gas is introduced, the result being that the particles head toward the exhaust port with the purging gas.

In the present invention, the wafer is covered when the supply of voltage is stopped. Also, using the fact that the particles in the processing chamber are positively charged, by imparting a negative potential to an electrically conductive plate or grid, the generated particles are trapped, or caused to migrate toward the exhaust port, thereby preventing them from reaching the substrate.

DESCRIPTION OF THE PREFERRED EMBODIMENTS

Embodiments of the present invention are described below in detail, with reference being made to the relevant accompanying drawings.

Figure 1:
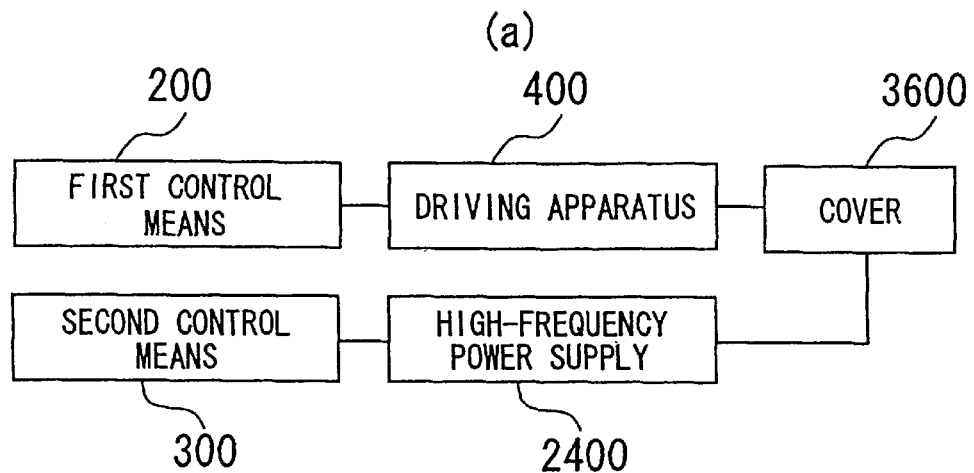
FIG. 1 is block diagrams that show a particle-removing apparatus of a semiconductor device manufacturing apparatus according to the present invention.
Figure 1:
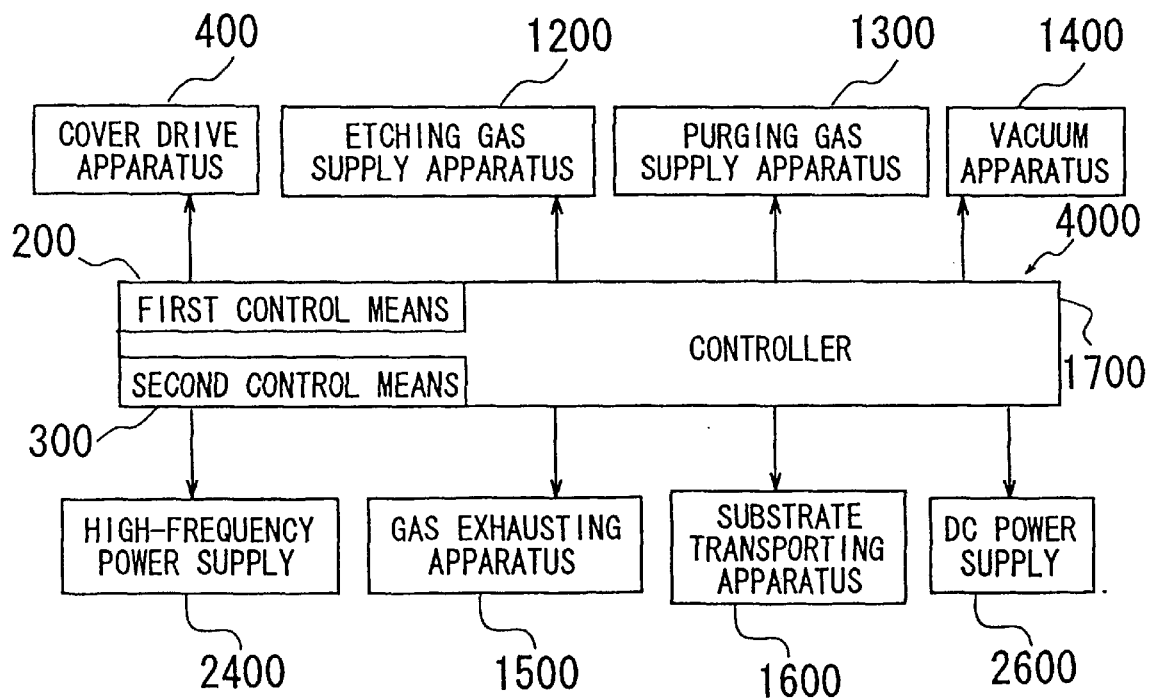
Figure 2:
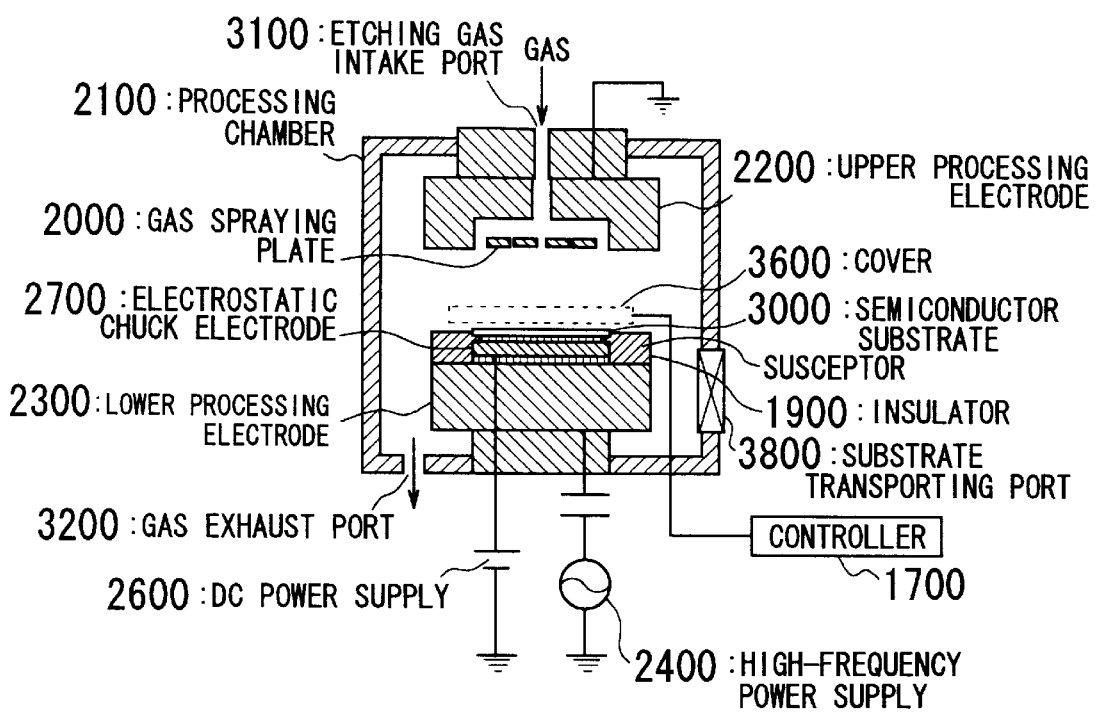
FIG. 2 is a drawing that shows the configuration of a particle-removing apparatus according to the present invention.

FIG. 1(a) is a block diagram that show the structure of an embodiment of the present invention, this being a semiconductor device manufacturing apparatus.

This block diagrams shows a semiconductor device manufacturing apparatus 4000 in which a high-frequency voltage is applied between an upper electrode 2200 and a lower electrode 2300, so as to generate a plasma inside a processing chamber 3100, thereby processing a substrate 3000, a cover 3600 being provided which covers the substrate, this cover 3600 being closed to cover the substrate 3000, thereby preventing the attachment of particles to the substrate 3000.

In the above-noted apparatus, there is provided a first control means 200, which controls the drive timing of the cover 3600, this control means 200 performing control so that the cover is changed from the opened condition to the closed condition immediately before stopping the application of the high-frequency voltage, and also performing control so that the cover 3600 is changed from the closed condition to the opened condition in synchronization with a transport operation of a substrate transport apparatus 1600, which is provided in the semiconductor device manufacturing apparatus 4000.

FIG. 1(b) is a block diagram that shows the overall configuration a plasma etching apparatus according to the present invention, this being formed by a driving apparatus 400 for the cover 3600, an etching gas supply apparatus 1200 for supplying etching gas to inside the processing chamber 2100, a purging gas supply apparatus 1300 for supplying purging gas to inside the processing chamber so as to exhaust the etching gas therefrom, a vacuum adjustment apparatus 1400 for the purpose of adjusting the degree of vacuum inside the processing chamber, an exhausting apparatus 1500 for exhausting the gas from within the processing chamber, a substrate transporting apparatus 1600 for transporting the substrate, a high-frequency (less than 10 GHz) power supply 2400 for generating a plasma, and a controller 1700, a DC power supply 2600 for the electrostatic chuck that holds the substrate, controller 1700, such as a microcomputer or sequencer or the like, which controls a driving apparatus 400, an etching gas supply apparatus 1200, a purging gas supply apparatus 1300, a vacuum adjustment apparatus 1400, an exhausting apparatus 1500, a substrate transporting apparatus 1600, a high-frequency power supply 2400, and the configuration being such that the substrate 3000 is subjected to the prescribed processing.

In the above-noted apparatus 4000, the first control means 200 and a second control means 300 are included within the controller 1700. Thus, the semiconductor device manufacturing apparatus used in the present invention, with the exception of the control of the cover 3600, has the same configuration as in the past.

Figure 9:
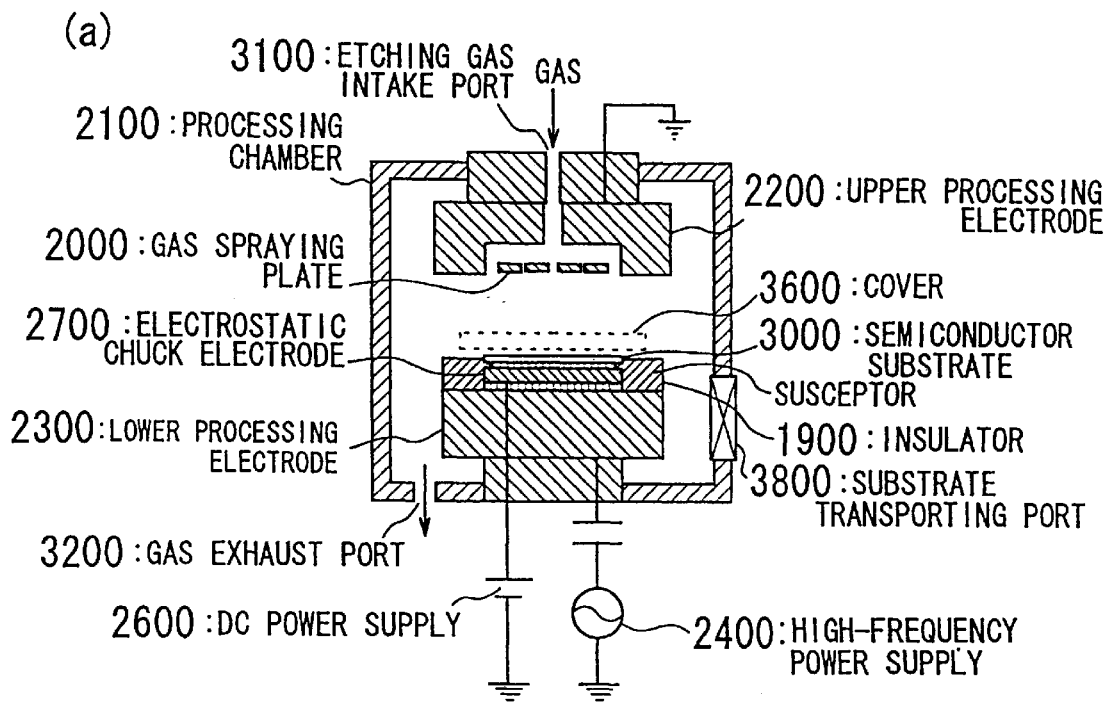
FIG. 9(a) is a drawing that shows the configuration of an etching apparatus of the past.
FIG. 9(b) is a drawing that shows the relationship between the operating condition of an etching apparatus and the number of particles generated.
Figure 9:
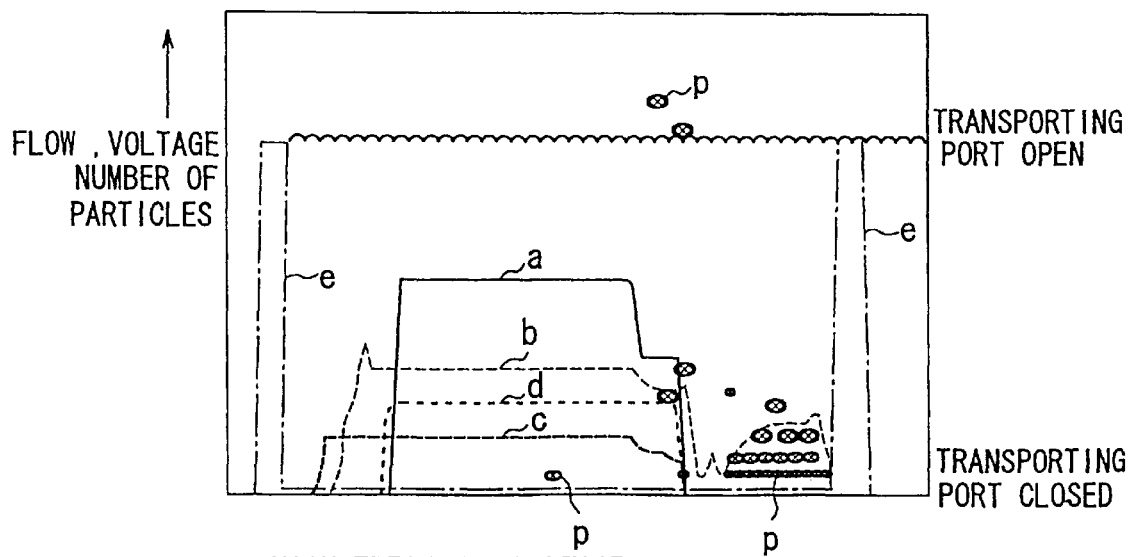

FIG. 9(*b*) is a drawing that shows the relationship between the number of particles P that are generated during plasma etching and the operating condition of the etching apparatus.

In this drawing, the number of particles P that are represented by the ellipses is the result of introducing the light from a laser into the region over the substrate in the processing chamber, and using a CCD camera to photograph the light scattered by particles that traverse this laser light, a signal that indicates the operating condition of the etching apparatus being simultaneously captured, this number being the accumulated value obtained by processing 25 substrates. The generation of particles P during etching has a clear relationship to the operating condition of the apparatus. That is, while there is almost no particle generation during etching, when the etching is completed, there is a time when a large number of particles are generated, and the frequency of generation of particles is high when the purging gas is introduced.

If a detailed examination is made of the images obtained from the light scattered by the particles, it is seen that the traces of particles at the time of the completion of the etching exhibit a tendency to be directed toward the substrate, and a tendency to be directed toward the exhaust port when the purging gas is introduced.

From the above, it can be envisioned that because the high-frequency power supply is stopped when the etching is completed, particles that float during etching fall and, because the viscous flow of the processing gas is small, the particles fly toward the substrate, on which all of its electrical charge have not been removed. It is further envisioned, however, that several seconds after the completion of etching, purging gas is introduced, the result being that the particles head toward the exhaust port with the purging gas.

The embodiments of the present invention to be described below were invented with the above-noted phenomenon as a basis.

The first to sixteenth embodiments of the present invention described below all can be applied to an RF plasma CVD apparatus, an RF plasma etching apparatus, and an RF plasma sputtering apparatus. Unless specifically indicated, the descriptions of the embodiments will be for the case of application to an RF plasma etching apparatus. However, it shall be understood that these embodiments can be applied as well to the above-noted other types of RF processing apparatuses.

First Embodiment

Figure 3:
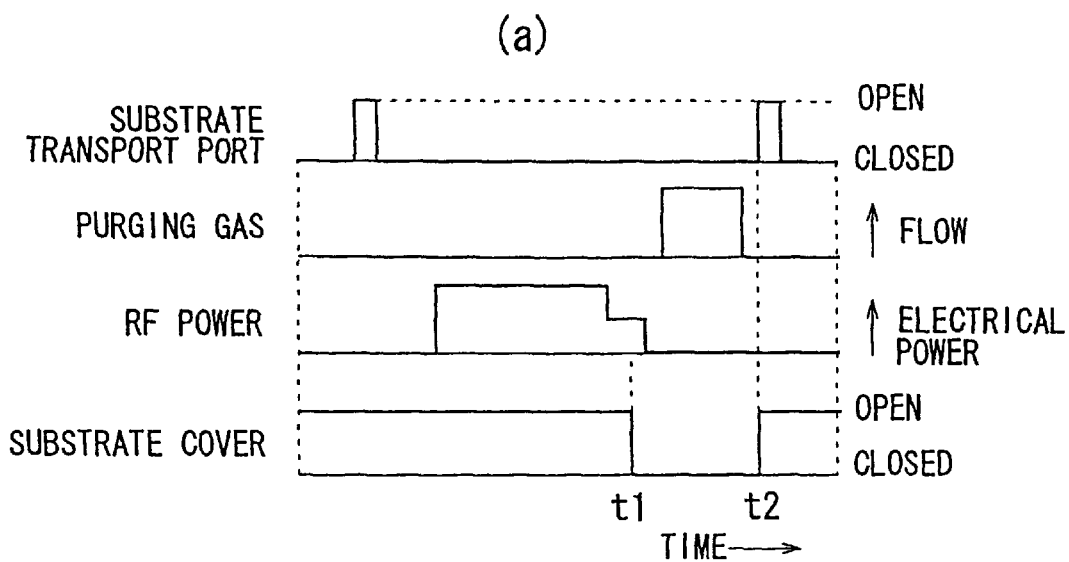
FIG. 3 is a drawing that shows the operational timing of a substrate cover in the first embodiment of the present invention.
Figure 3:
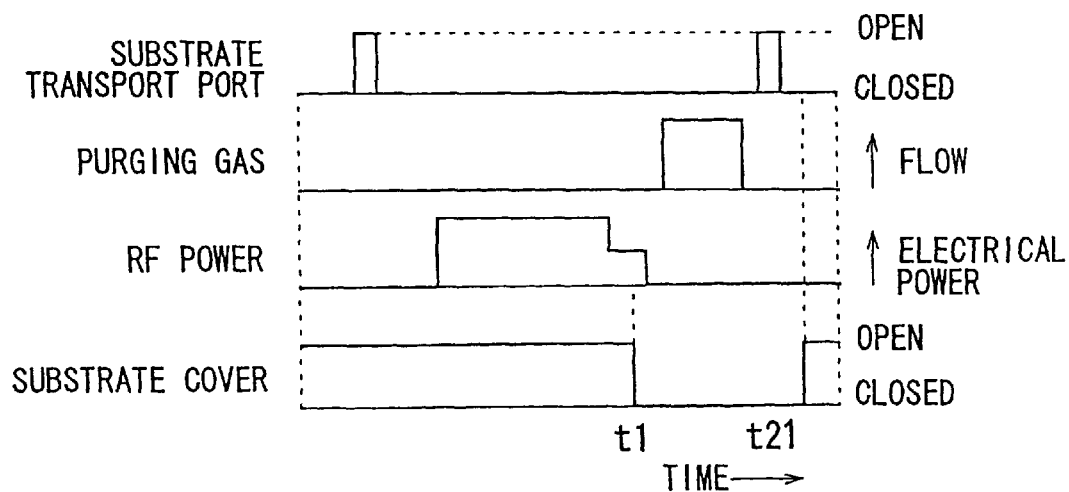

The flow of cover operation timing in the first embodiment of the present invention is shown in FIG. 3(*a*). At the time t1, immediately before the stopping of the high-frequency voltage, the cover 3600 that covers the substrate 3000 is closed and, at the instant that the high-frequency voltage is stopped, particles that fall toward the substrate 3000 are caught by the cover 3600. The cover 3600 remains closed during the introduction of the purging gas, at which time there is a high frequency of generation of particles and, after the introduction of the purging gas is stopped, at the time t2, immediately before the processed substrate is transported to outside the processing chamber 2100, the cover is opened. Thus, during the period of time when many particles P would fall onto the substrate, because the cover 3600 is in the closed condition, thereby reliably covering the substrate 3000, the attachment of the particles onto the substrate 3000 is prevented.

The shape of the cover can be that of a single sheet, or that of a plurality of blades, such as those of a camera shutter. In contrast to the prior art, the present invention is not limited in application to a plasma etching apparatus, and can be applied as well to other apparatuses, such as a plasma CVD apparatus, which uses plasma to perform processing.

As shown in FIG. 3(*b*), the timing of the opening of the cover can be established at time t21, which is immediately after the transport of the processed substrate to outside the processing chamber 2100.

Second Embodiment

Figure 4:
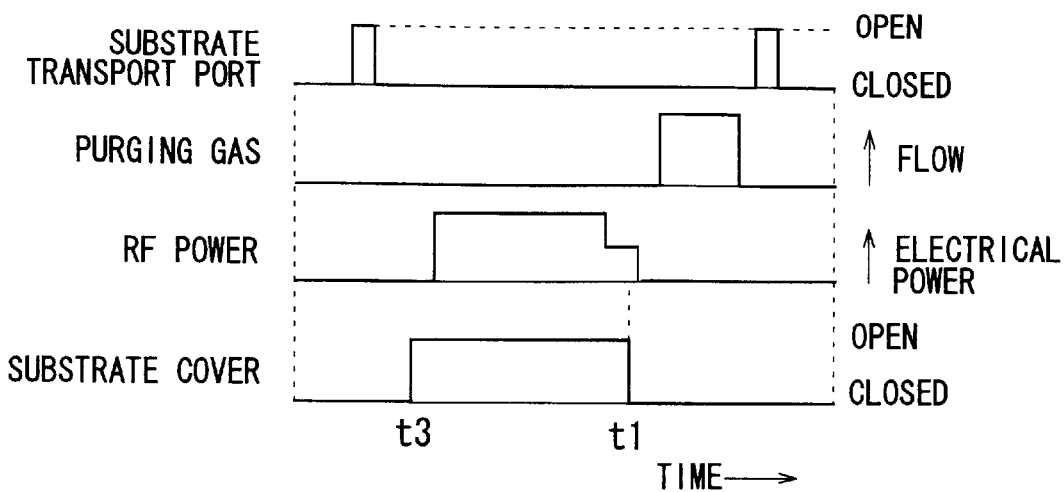
FIG. 4 is a drawing that shows the operational timing of a substrate cover in the second embodiment of the present invention.

The flow of cover operation timing in the second embodiment of the present invention is shown in FIG. 4. At the time t1, immediately before the stopping of the high-frequency voltage, the cover 3600 that covers the substrate 3000 is closed and, at the instant that the high-frequency voltage is stopped, particles that fall toward the substrate 3000 are caught by the cover 3600. After the processed substrate 3000 is transported to outside the processing chamber 2100, at the time t3, immediately before the next substrate is transported into the processing chamber, the cover 3600 is opened. Thus, by operating the cover 3600 in this manner, attachment of particles that fall onto the substrate is prevented.

Third Embodiment

Figure 5:
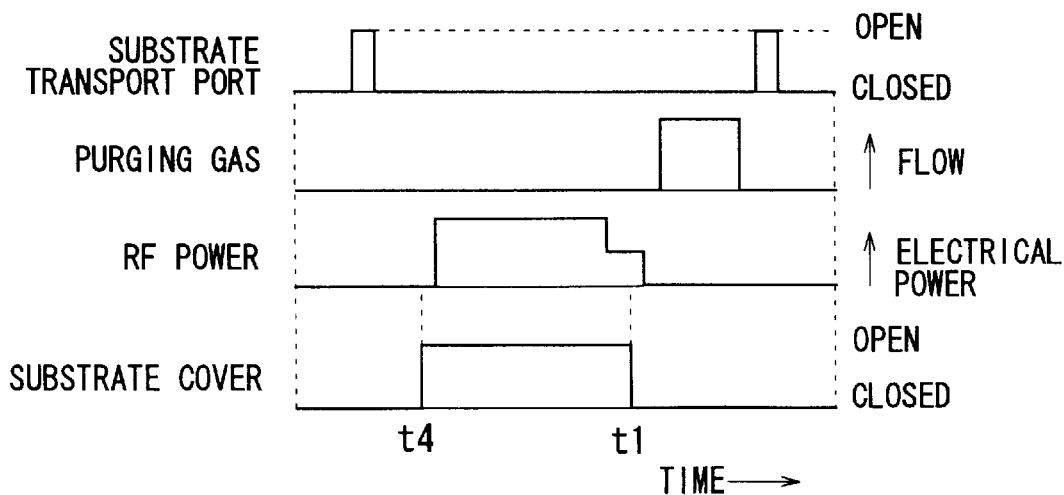
FIG. 5 is a drawing that shows the operational timing of a substrate cover in the third embodiment of the present invention.

The flow of cover operation timing in the third embodiment of the present invention is shown in FIG. 5. At the time t4, immediately before the application of the high-frequency voltage, the cover 3600 that covers the substrate 3000 is opened and, at time t1, immediately before the high-frequency voltage is stopped, the cover is closed. By closing the cover when etching is not being performed, particles occurring because of peeling from the upper electrode 2200 or from the inside walls of the processing chamber 2000 are caught by the cover, thereby preventing the attachment of these particles to the substrate.

Furthermore, in addition to the above-noted configurations, it is possible to use a configuration in which a detection means is provided that detects that the cover has been placed in the closed condition, the result of the detection by this detection means being used to turn off the high-frequency power supply 2400.

Fourth Embodiment

Figure 6:
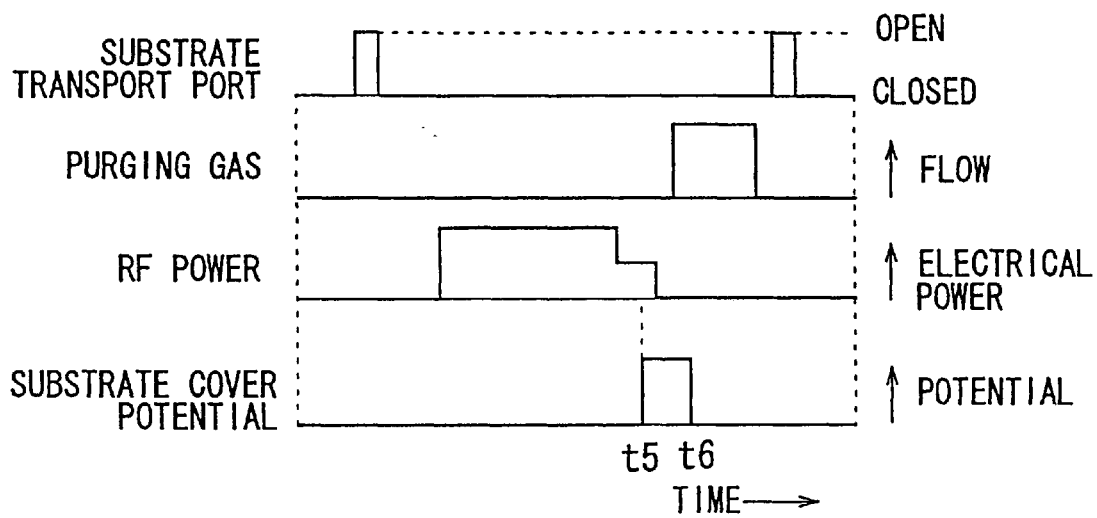
FIG. 6 is a drawing that shows the timing of the application of a potential to the substrate cover in the fourth embodiment of the present invention.
Figure 6:
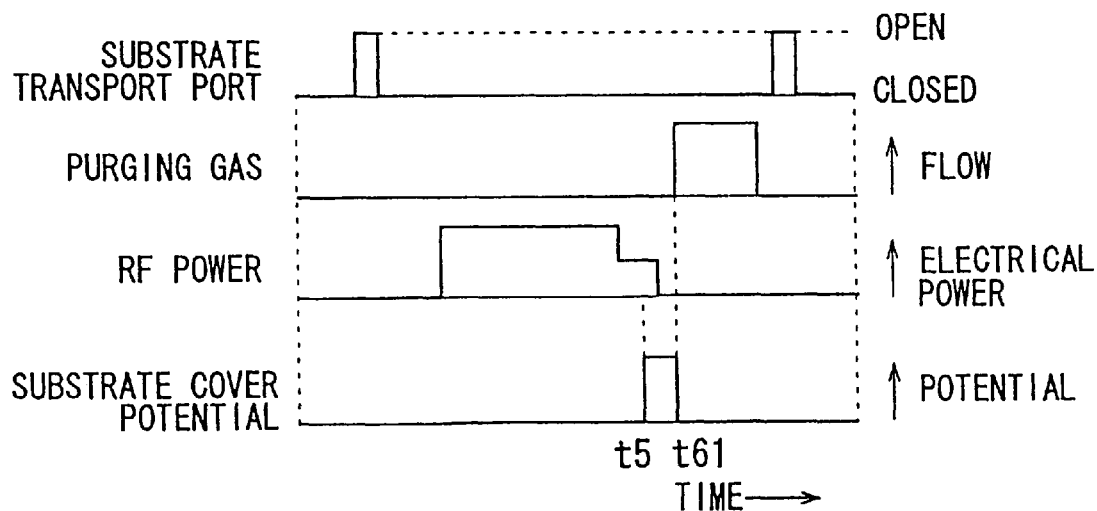

The flow of cover operation timing in the fourth embodiment of the present invention is shown in FIG. 6(a). In addition to the first to the third embodiments, during the period of time from t5, immediately before the stopping of the application of the high-frequency voltage, to the time t6, several seconds after the start of the introduction of the purging gas, a potential is imparted to the cover 3600. Because even immediately after the stopping of the application of the high-frequency voltage, particles fall toward the charged substrate that has a residual charge from the electrostatic chuck, this cover potential can be selected as a value that is either equivalent to the self-bias potential of the lower electrode 2300, or as a potential with the same polarity as and a larger absolute value than the above-noted self-bias potential. Particles that are generated immediately after the stopping of application of the high-frequency voltage fall toward the cover and are attracted to the cover 3600. Particles that are generated after the introduction of the purging gas follow the flow of the purging gas, and fall toward the exhaust port, so that they do not become attached to the substrate.

The material of the cover 3600 can be the same conductive material as the processing chamber 2100 inner wall, this being for example an aluminum alloy and, to reduce the number of particles that are generated, it can also have a metallic surface that is covered with aluminum oxide or silicon oxide.

It is also possible, as shown in FIG. 6(b), to impart the potential at time t61, immediately before the introduction of the purging gas.

Fifth Embodiment

Figure 7:
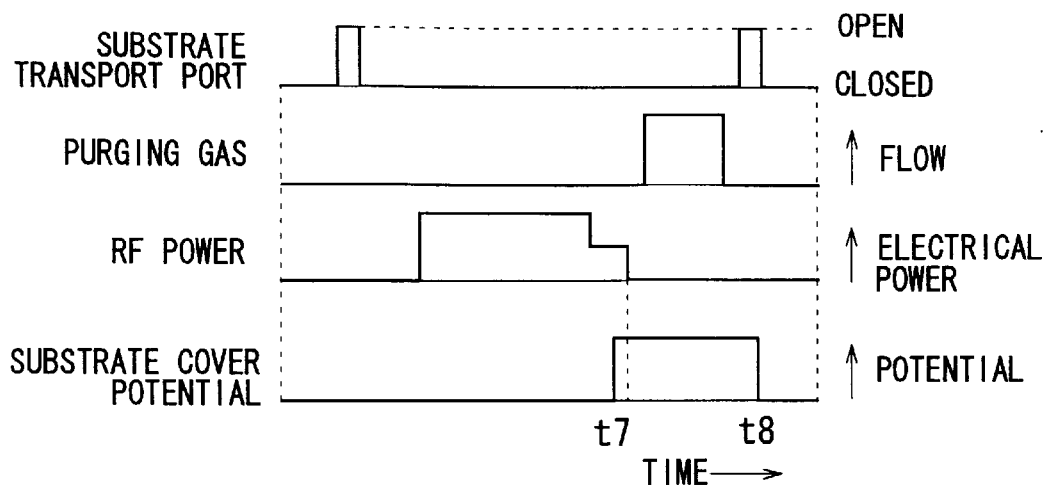
FIG. 7 is a drawing that shows the timing of the application of a potential to the substrate cover in the fifth embodiment of the present invention.

The flow of cover operation timing in the fifth embodiment of the present invention is shown in FIG. 7.

In the cases of the second and third embodiments of the present invention, as shown in FIG. 4 and FIG. 5, it is possible to impart a potential to the cover from the time t7, at which the application of the high-frequency voltage is stopped, until time t8, at which point the processed substrate has been completely transported to outside the processing chamber, this cover potential being selectable either as equivalent to the self-bias potential of the lower electrode 2300, or as a potential with the same polarity as and a larger absolute value than the above-noted self-bias potential. Particles that are generated in the period from the time immediately after the stopping of application of the high-frequency voltage to the time the transporting port opens are collected by the cover, and therefore do not become attached to the substrate.

Sixth Embodiment

Figure 8:
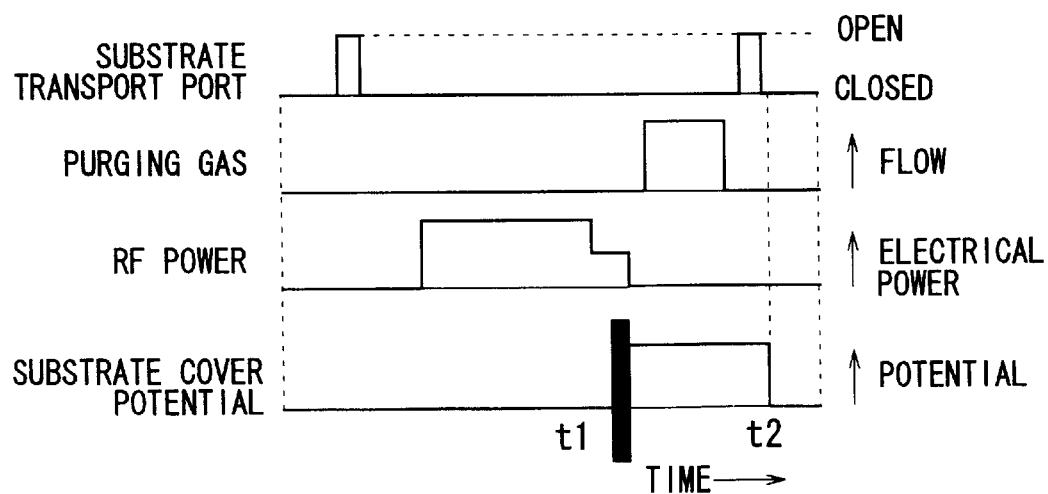
FIG. 8 is a drawing that shows the timing of the application of a potential to the substrate cover in the sixth embodiment of the present invention.

The flow of cover operation timing in the sixth embodiment of the present invention is shown in FIG. 8.

In the cases of the second and third embodiments of the present invention, as shown in FIG. 4 and FIG. 5, it is possible to impart a potential to the cover, from the time that the cover is started to be closed until the time the cover is opened. By making the cover 3600 the same potential as the lower processing electrode 2300 during the application of the high-frequency voltage, there is no discharge between the substrate 3000 and the cover 3600, thereby enabling prevention of damage to the substrate and the generation of particles between the cover and the substrate.

Then, after the application of the high-frequency voltage is stopped, the cover potential is either made equivalent to the self-bias potential, or a potential that has the same polarity as and an absolute value that is greater than the self-bias value.

It is also possible to apply this embodiment to the first embodiment.

Seventh Embodiment

Figure 10:
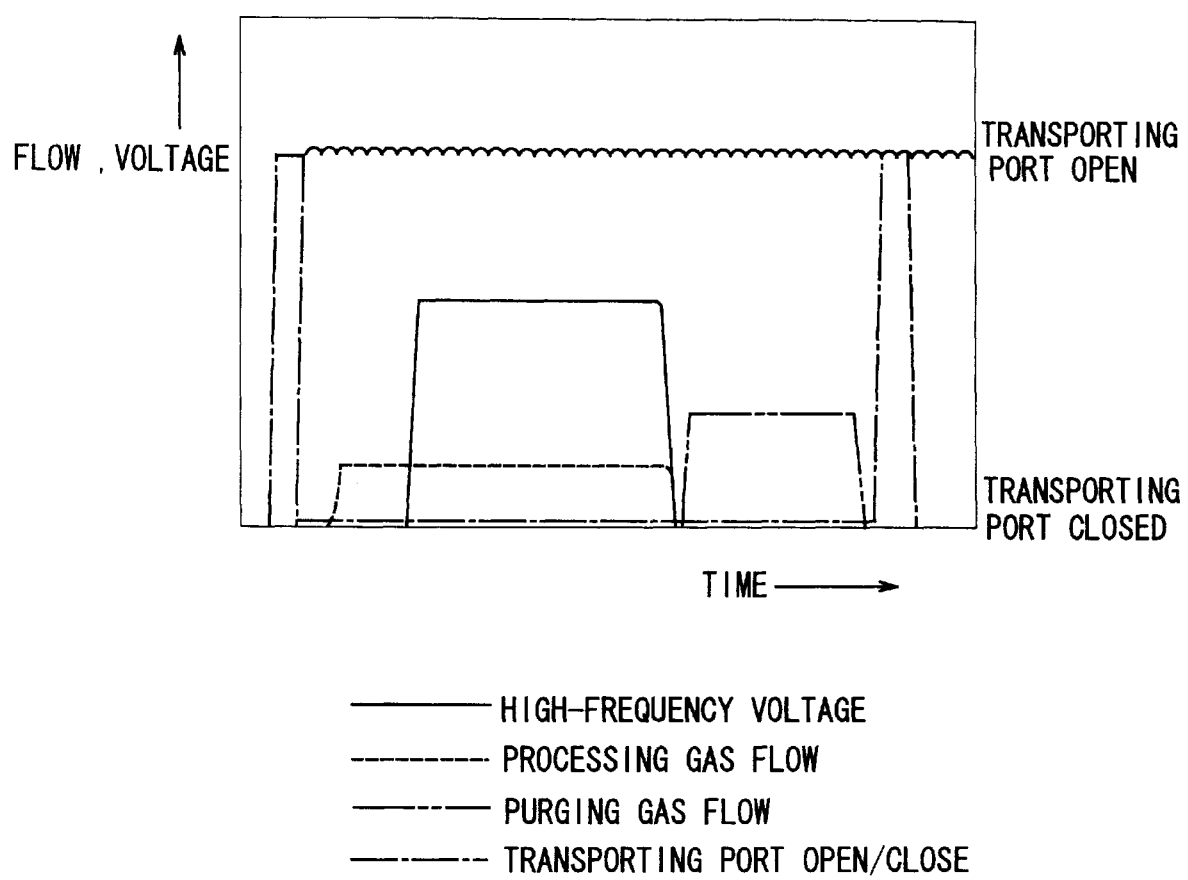
FIG. 10 is a drawing that shows the operational timing in a conventional etching apparatus.

FIG. 10 shows one typical operating cycle of an etching apparatus generally used in a semiconductor device plant.

Etching is performed by introducing a highly reactive processing gas such as chlorine into the processing chamber from a spraying plate that also serves as the upper processing electrode that is in opposition to the substrate and, when the pressure reaches a prescribed pressure, applying a voltage between the electrodes, so as to generate a plasma of the processing gas.

When etching is completed, the application of the high-frequency voltage and the introduction of the processing gas are stopped simultaneously and, after several seconds have elapsed, a purging gas having a low reactivity, such as a halogen gas, is introduced.

Figure 11:
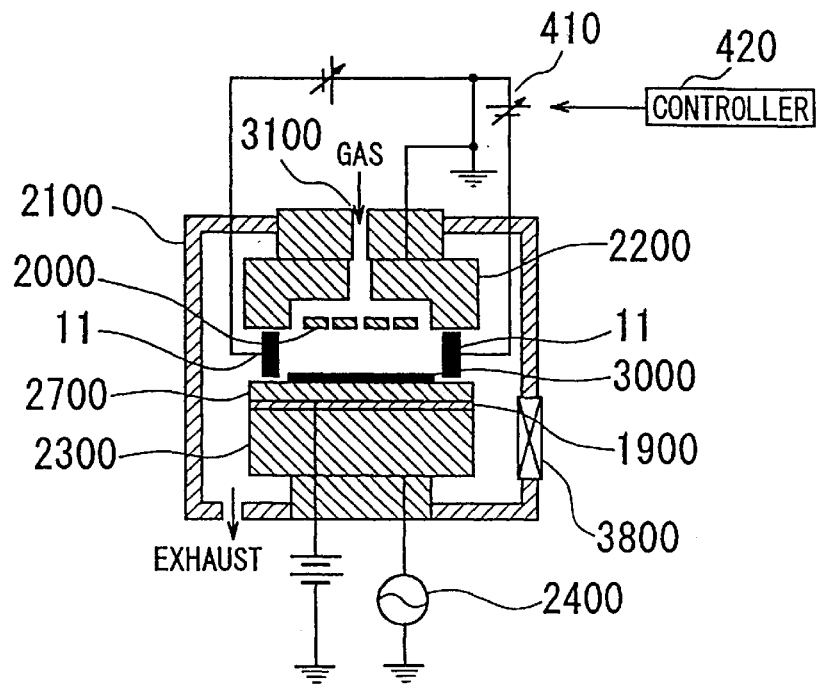
FIG. 11 is drawing that shows the seventh embodiment of the present invention.
Figure 11:
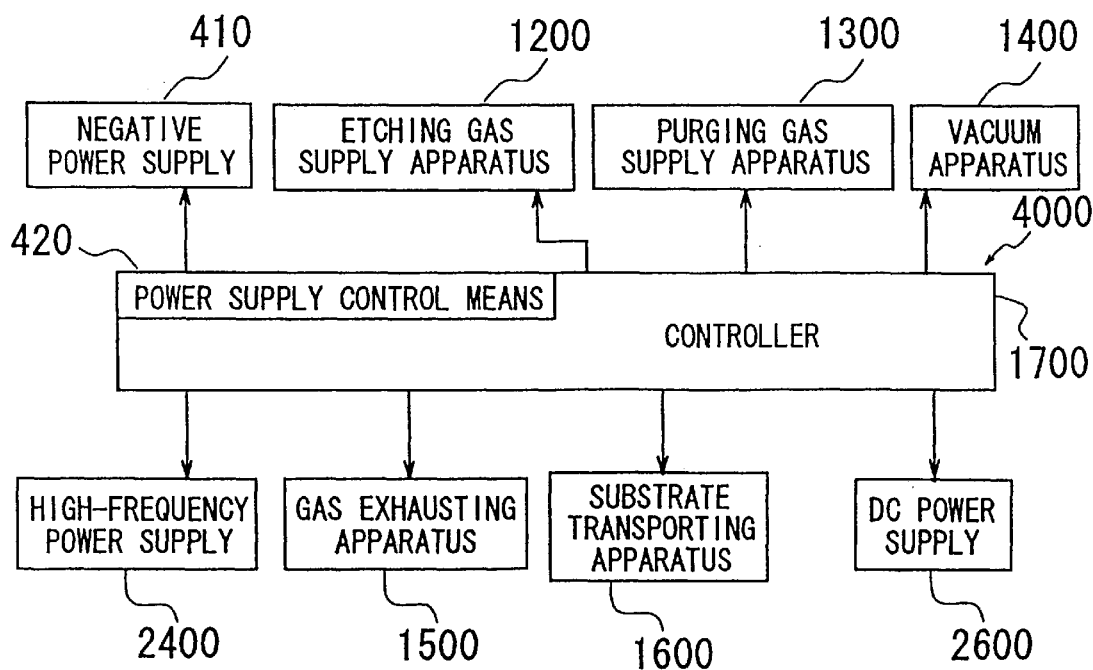

In an etching apparatus of the seventh embodiment of the present invention, as shown in FIG. 11, the process gas supply is stopped when the etching is completed. When this is done, it is known that the particles have a positive charge and, by making use of this phenomenon, by imparting a negative potential to an electrically conductive particle-removing electrode 11 that is provided between the upper processing electrode 2200 and lower processing electrode 2300 inside the processing chamber 2100, particles are forcibly removed. As long as there is no influence on the process, the particle-removing electrode 11 can be any shape such as that of a sheet or grid.

The large number of falling particles that are generated at the instant that the high-frequency voltage is stopped are trapped by the particle-removing electrode 11, thereby preventing their reaching the substrate 3000.

It is also possible to adopt a configuration in which a power supply controller 420 and a negative power supply 410 are provided, whereby a negative potential is applied to the electrode 11 in synchronization with the completion of the etching.

Eighth Embodiment

Figure 12:
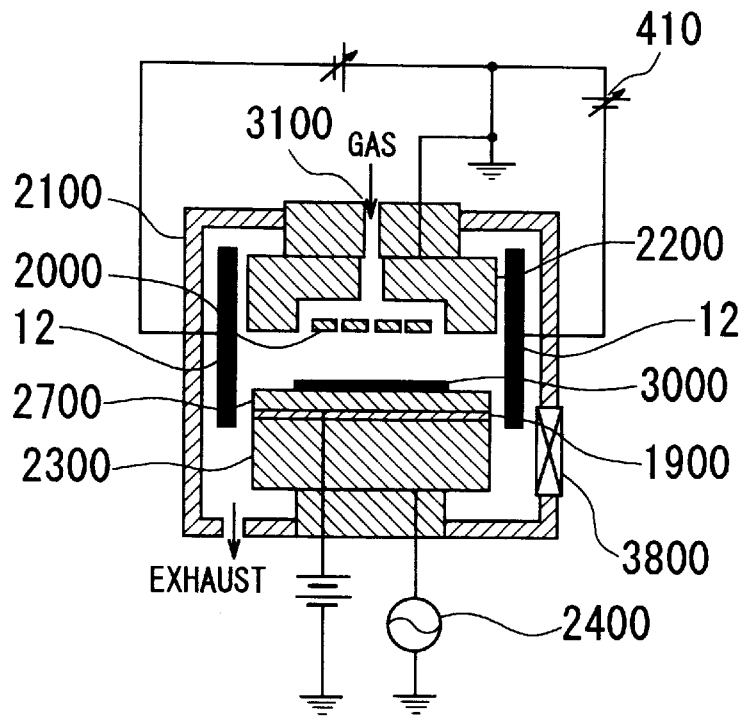
FIG. 12 is drawing that shows the eight embodiment of the present invention.

FIG. 12 shows an etching apparatus into which a function has been built to trap particles, using an attachment-prevention shield.

In a semiconductor device manufacturing apparatus, an attachment-prevention shield 12 is often used to prevent the attachment of sediments that occur during processing onto the chamber walls.

These attachment-prevention shields 12 are provided between the processing electrodes 2200, 2300 and the side walls of the processing chamber 2100, and intentionally cause sediments to be deposited onto these attachment-prevention shields 12, and by replacing the attachment-prevention shields 12, it is possible to reduce the number of times the inside of the chamber needs to be cleaned.

The attachment-prevention shield 12 is often made of an electrically conductive metal, the attachment-prevention shield 12 being kept electrically insulated from the processing chamber, and when the etching is completed the supply of processing gas is stopped and a negative potential is imparted to the attachment-prevention shield 12.

The large number of positively charged falling particles that are generated at the instant that the high-frequency voltage is stopped are pulled in by the negative potential on the attachment-prevention shield 12 and trapped and ultimately are trapped on the wall of the attachment-prevention shield 12, thereby preventing their reaching the substrate 3000.

Ninth Embodiment

Figure 13:
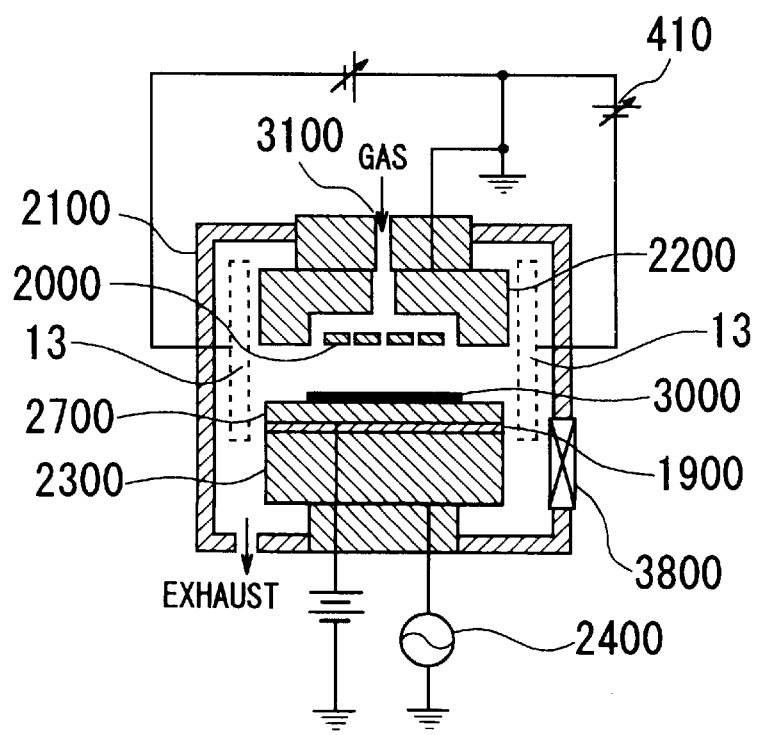
FIG. 13 is drawing that shows the ninth embodiment of the present invention.

FIG. 13 shows an etching apparatus into which a function has built to trap particles, using an electrically conductive grid 13.

Specifically, the grid 13 is provided between the processing electrodes 2200, 2300 and the side walls of the processing chamber 2100, this grid 13 being installed so that it is electrically insulated from the processing chamber and, when the etching is completed, the supply of processing gas is stopped and a negative potential is imparted to the grid 13.

The large number of positively charged particles that fall when the high-frequency voltage is stopped are pulled in by the negative potential of the grid 13, and are ultimately trapped by this grid 13, so that they are prevented from reaching the substrate.

Tenth Embodiment

Figure 14:
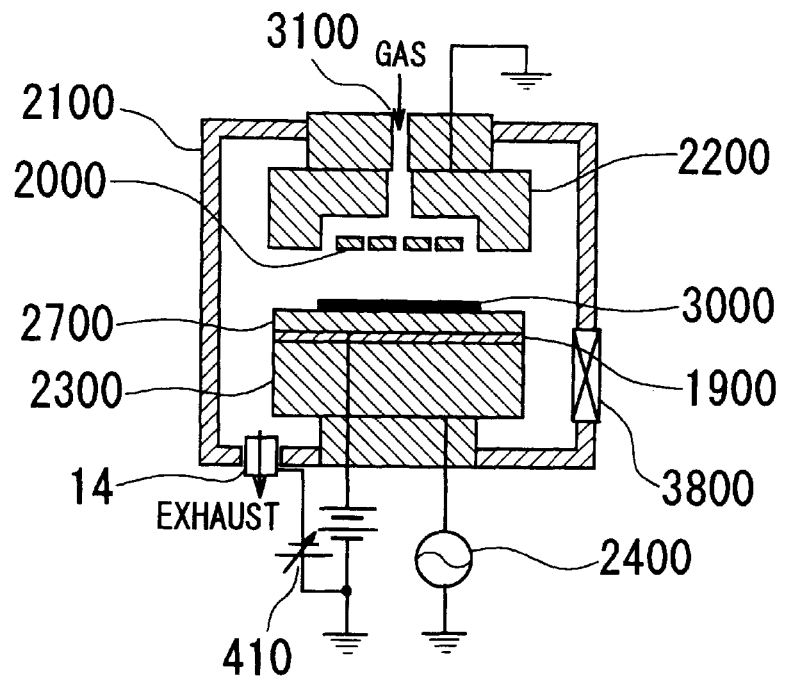
FIG. 14 is drawing that shows the tenth embodiment of the present invention.

FIG. 14 shows an etching apparatus in which a gas exhaust port 14 at the bottom of the processing chamber is formed of an electrically conductive material such as a metal, this gas exhaust port 14 being electrically insulated, so that particles are guided to the exhaust port and forcibly exhausted, the result being that the particles do not fall onto the substrate.

That is, when the supply of the processing gas is stopped at the completion of the etching, a negative potential is imparted to the exhaust port 14, the result being that the large number of positively charged particles that fall at the instant the high-frequency voltage is stopped are pulled in toward the exhaust port 14, which has a negative potential, these particles being ultimately exhausted, so that they are prevented from reaching the substrate.

Eleventh Embodiment

Figure 15:
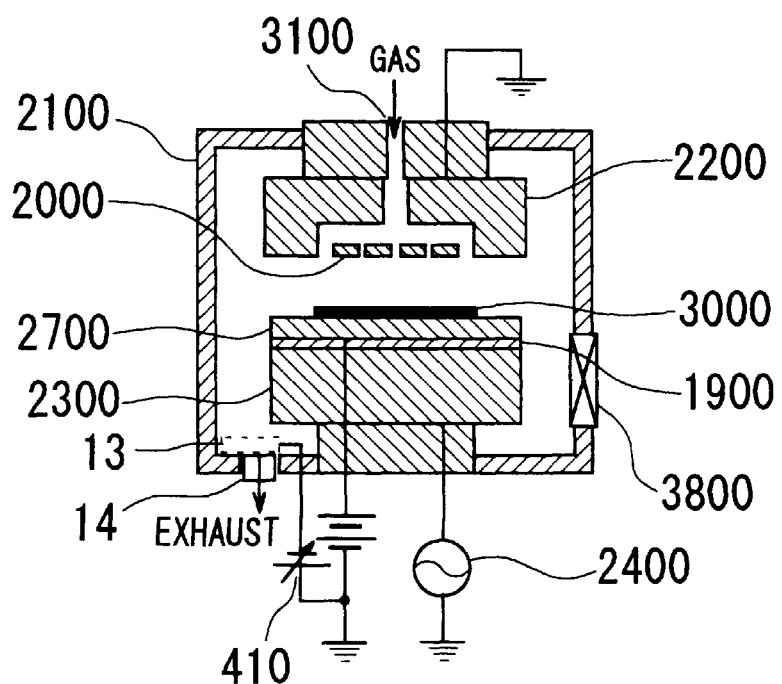
FIG. 15 is drawing that shows the eleventh embodiment of the present invention.

FIG. 15 shows an etching apparatus in which an electrically conductive grid 13 is provided in proximity to the gas exhaust port 14, this grid serving to trap particles.

Specifically, the grid 13 is installed in front of the exhaust port 14 so that it is electrically insulated with respect to the chamber, the supply of the processing gas being stopped and a negative potential being imparted to the grid 13 when etching is completed.

The large number of positively charged particles that fall at the instant the high-frequency voltage is stopped are pulled in toward the grid 13 because of its negative potential, and are ultimately trapped by the grid 13 or exhausted from the exhaust port 14, so that they are prevented from reaching the substrate.

Twelfth Embodiment

Figure 16:
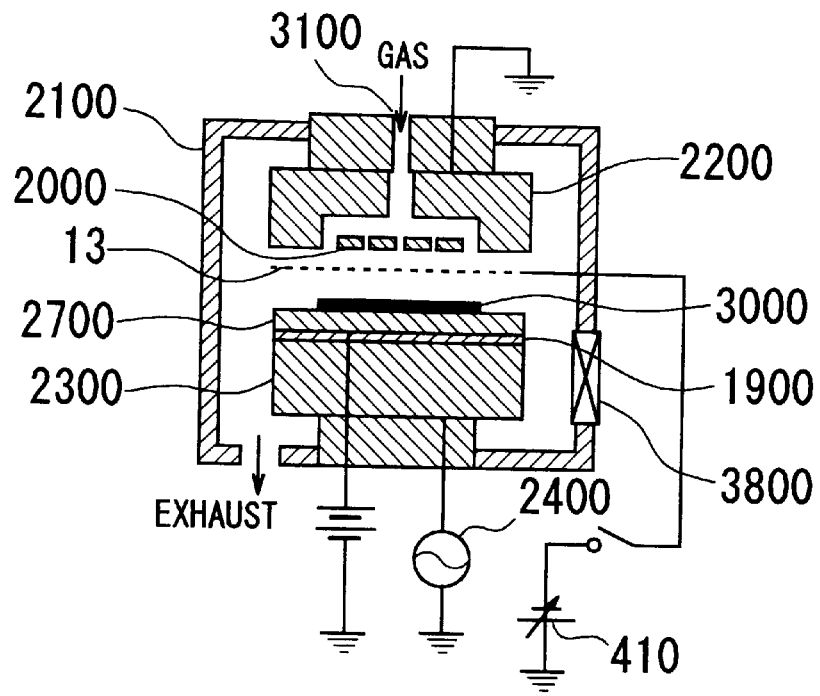
FIG. 16 is drawing that shows the twelfth embodiment of the present invention.

FIG. 16 shows the twelfth embodiment of the present invention.

In this embodiment, the electrically conductive grid 13 is installed between the upper electrode 2200 and the lower electrode 2300, and is placed in an electrically floating condition. By doing this, during the process, that is during discharge, the grid 13 tracks to the potential of the plasma, so that it is in the floating condition.

After the process is completed, when a negative potential is imparted to the grid 13, particles are pulled in toward the negative potential of the grid 13, thereby being prevented from reaching the substrate. Then, in this condition, the semiconductor substrate 3000 is transported.

Thirteenth Embodiment

Figure 17:
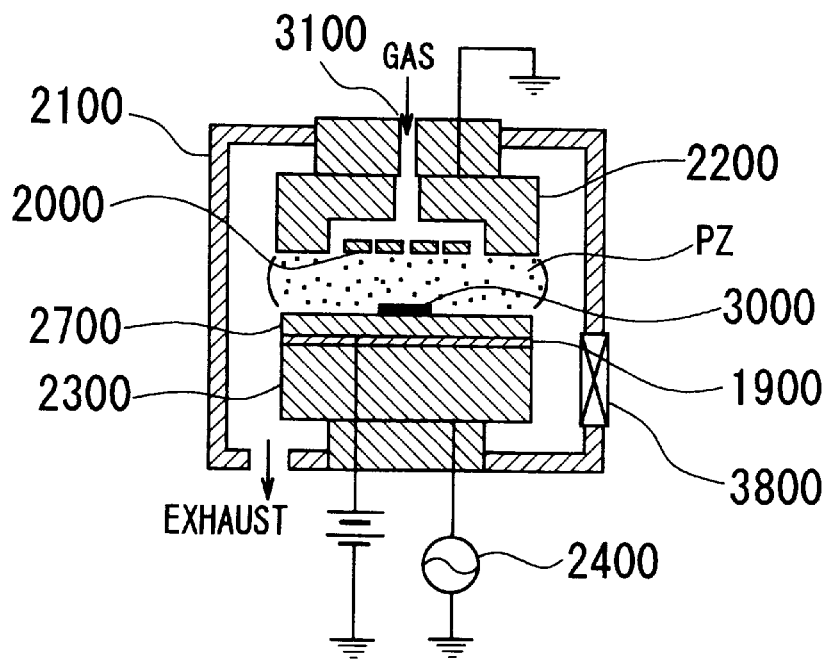
FIG. 17 is drawing that shows the thirteenth embodiment of the present invention.

FIG. 17 shows the thirteenth embodiment of the present invention.

In this embodiment, a plasma PZ is generated that is sufficiently large with respect to the semiconductor substrate 3000. This plasma PZ is generated in accordance with the diameters of the upper electrode 2200 and the lower electrode 2300 and, in the case of FIG. 17, this is a plasma that is generated to considerably outside the substrate 3000.

By doing this, so that the plasma PZ extends greatly beyond the substrate 3000, particles drop along the outer periphery of the plasma PZ, thereby preventing them from falling onto the substrate 3000.

Fourteenth Embodiment

Figure 18:
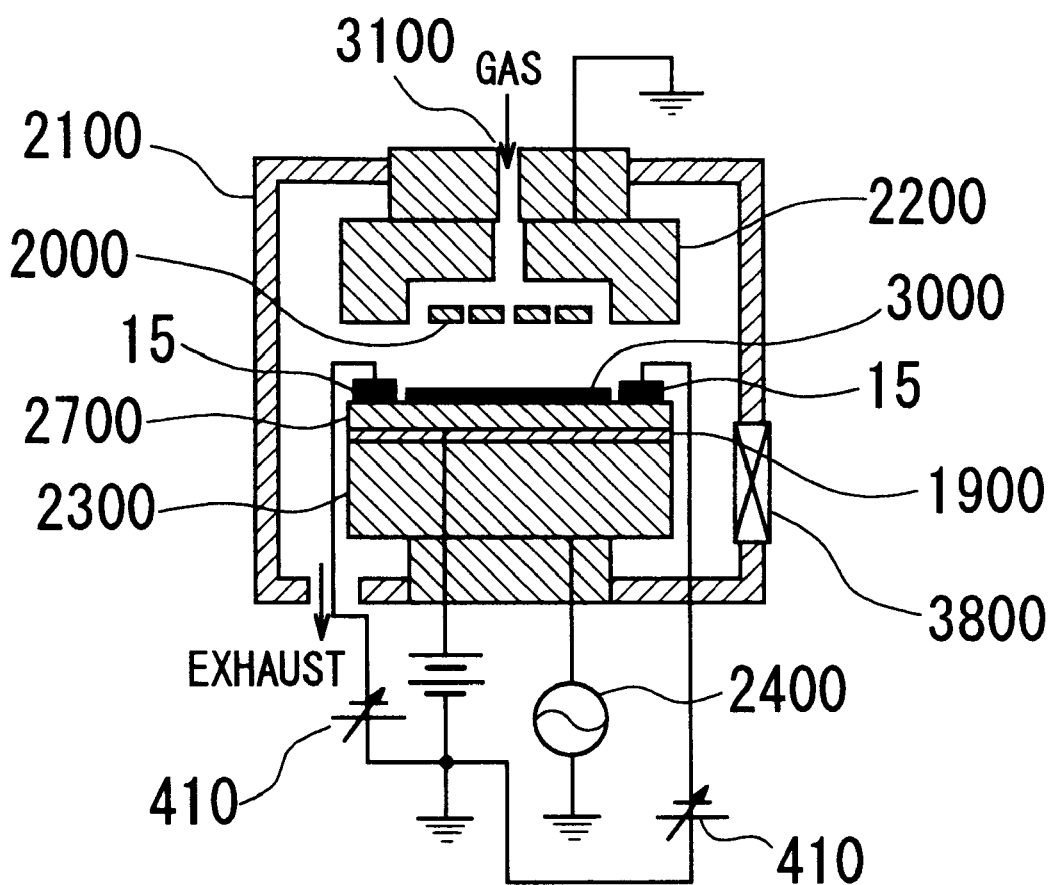
FIG. 18 is drawing that shows the fourteenth embodiment of the present invention.

FIG. 18 shows the fourteenth embodiment of the present invention.

In this embodiment, a donut-shaped electrode 15 is installed over the lower electrode 2300 so as to surround the substrate 3000, a negative voltage that has an absolute value that is greater than the self-bias voltage being applied to the electrode 15, in which case the applied voltage can be a DC voltage.

The timing of the application of the above-noted voltage is the time that the process is completed and the time that the plasma power supply is turned off.

A negative bias is applied with respect to the voltage applied to the lower electrode 2300, which is the cathode electrode, and this is caused to vary in the same manner as the self-bias voltage.

By doing the above, positively charged particles are guided to the electrode 15, thereby preventing them from falling onto the substrate 3000.

Fifteenth Embodiment

Figure 19:
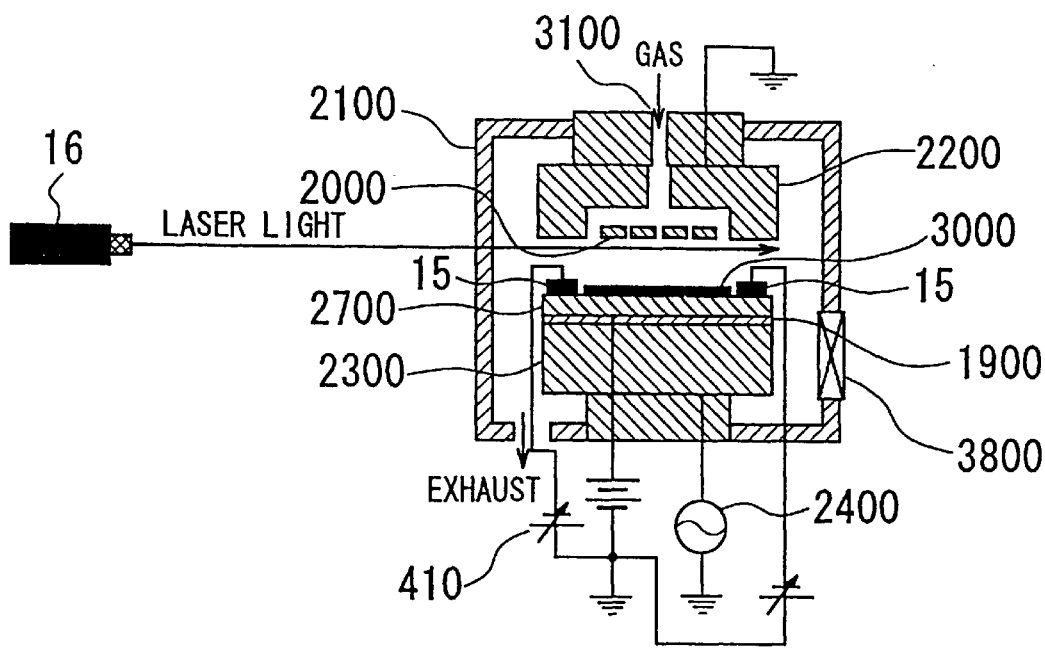
FIG. 19 is drawing that shows the fifteenth embodiment of the present invention.
Figure 19:
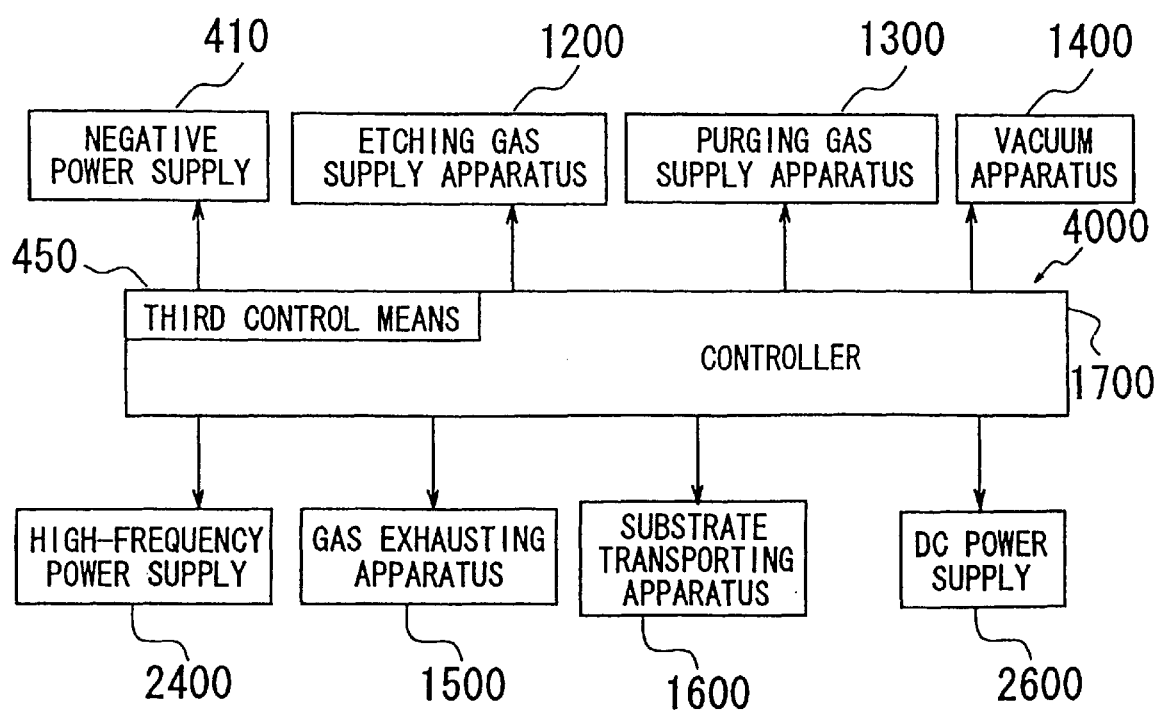

FIG. 19 shows the fifteenth embodiment of the present invention.

In this embodiment, a laser apparatus is introduced for the purpose of monitoring the generation of particles. The location at which the laser light is shined is the region under the anode electrode, this being the upper electrode 2200. By adopting this configuration, it is possible to detect particles at an early stage that are trapped in the region near the plasma sheath.

Then, after the particles are detected, a negative voltage is applied to the electrode 15, so as to collect the particles, preventing them from falling onto the substrate 3000.

Sixteenth Embodiment

Figure 20:
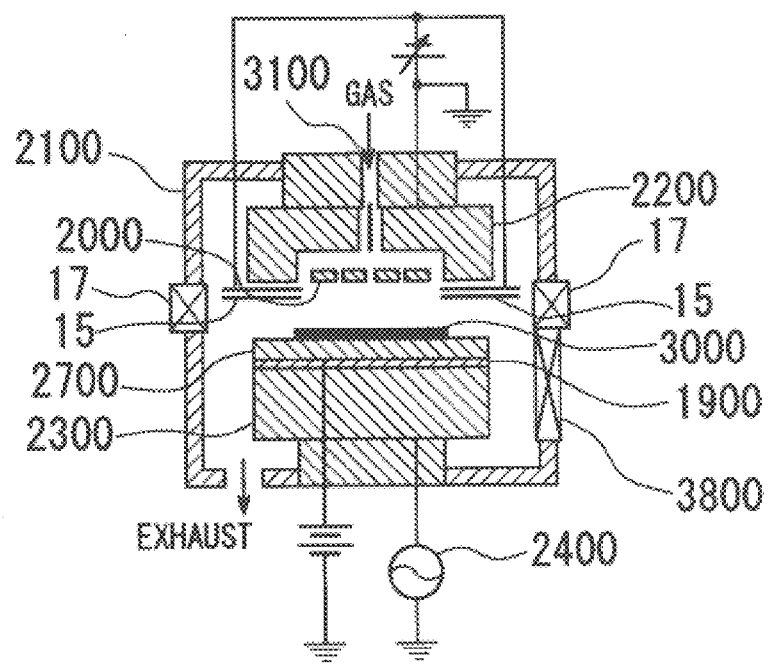
FIG. 20 is drawing that shows the sixteenth embodiment of the present invention.
Figure 21:
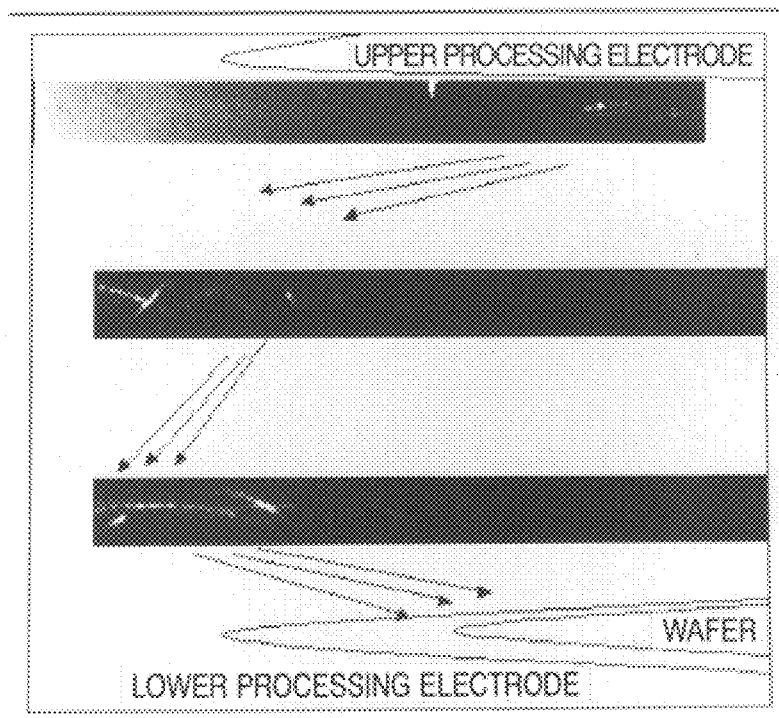
FIG. 21 is a photograph that show the movement of particles in a plasma.

FIG. 20 shows the sixteenth embodiment of the present invention.

In this embodiment, a particle-removing electrode 15 is provided between the upper electrode 2200 and the lower electrode 2300, and a gate valve 17 is installed on a side wall of the processing chamber near the particle-removing electrode 15, a vacuum pump or other such exhausting apparatus being connected to the outside thereof. A provision is also made to apply a negative voltage to the electrode 15.

When the processing is completed and the voltage applied to the cathode electrode, which is the lower electrode 2300, is cut off, a negative voltage is applied to the electrode 15. By doing this, particles are pulled toward the gate valve 17. When this occurs, the gate valve 17 is simultaneously opened, so that the particles are exhausted, thereby preventing the particle from falling onto the substrate 3000.

In FIG. 19, the reference numeral 450 denotes a third control means for the purpose of applying a negative voltage to the particle-removing electrode 15, based on the results of the detection of particles within the processing chamber.

All of the above-described first embodiment through sixteenth embodiment can be applied in common to an RF plasma CVD apparatus, an RF plasma etching apparatus, and an RF plasma sputtering apparatus.

In contrast to the above, the seventeenth through thirty-second embodiments to be described below can be applied in common to a DC plasma CVD apparatus, a DC plasma etching apparatus, and a DC plasma sputtering apparatus.

Seventeenth Embodiment

Figure 22:
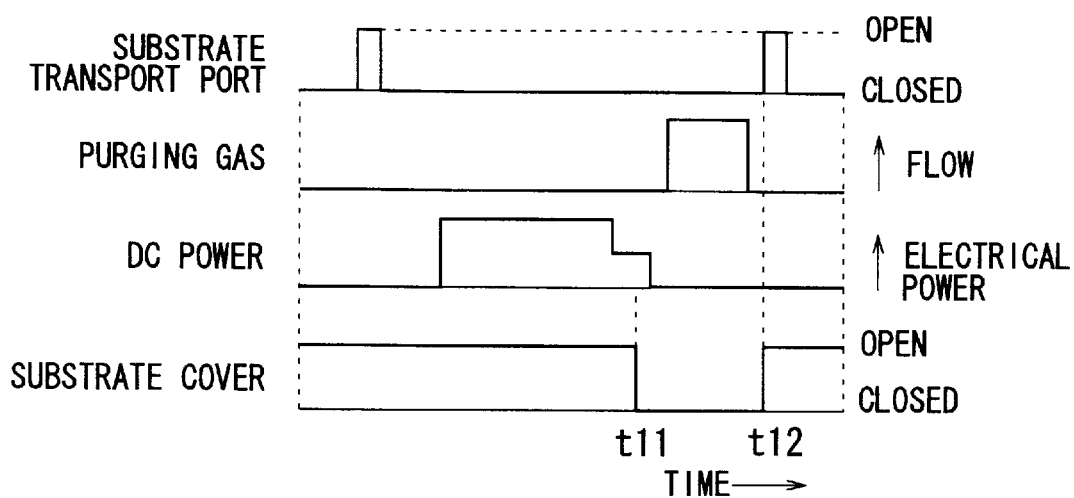
FIG. 22 is a drawing that shows the operational timing of a substrate cover in the seventeenth embodiment of the present invention.

The flow of cover operation timing in the seventeenth embodiment of the present invention is shown in FIG. 22.

At the time t11, immediately before the stopping of the DC voltage, the cover 3600 that covers the substrate 3000 is closed and, at the instant that the DC voltage is stopped, particles that fall toward the substrate 3000 are caught by the cover 3600. The cover 3600 remains closed during the introduction of the purging gas, at which time there is a high frequency of generation of particles and, after the introduction of the purging gas is stopped, at the time t12, immediately before the processed substrate is transported to outside the processing chamber 2100, the cover is opened. Thus, during the period of time when many particles P would fall onto the substrate, because the cover 3600 is in the closed condition, thereby reliably covering the substrate 3000, the attachment of the particles P onto the substrate 3000 is prevented.

The shape of the cover can be that of a single sheet, or that of a plurality of blades, such as those of a camera shutter.

Eighteenth Embodiment

Figure 23:
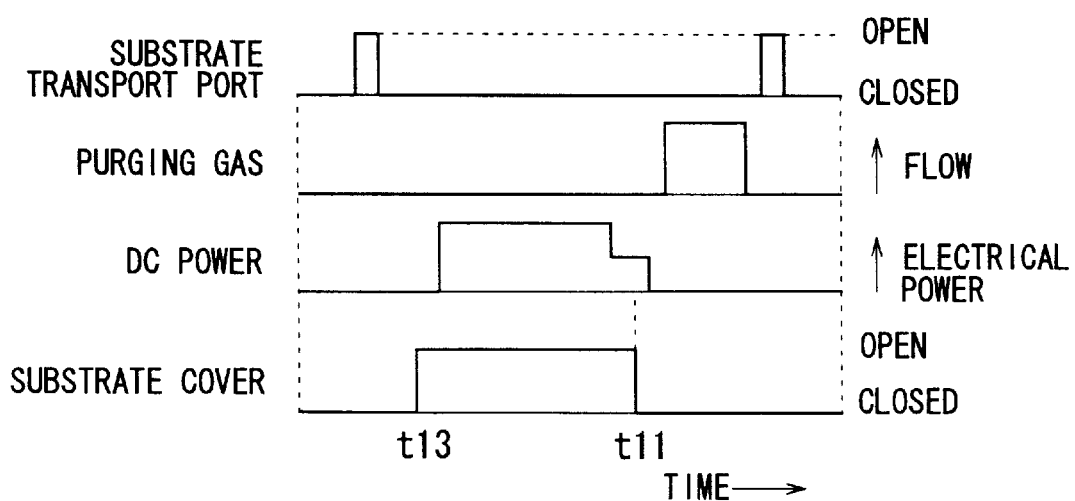
FIG. 23 is a drawing that shows the operational timing of a substrate cover in the eighteenth embodiment of the present invention.

The flow of cover operation timing in the eighteenth embodiment of the present invention is shown in FIG. 23.

At the time t11, immediately before the stopping of the DC voltage, the cover 3600 that covers the substrate 3000 is closed and, at the instant that the DC voltage is stopped, particles that fall toward the substrate 3000 are caught by the cover 3600. After the processed substrate 3000 is transported to outside the processing chamber 2100, at the time t13, immediately before the next substrate is transported into the processing chamber, the cover 3600 is opened. Thus, by operating the cover in this manner, attachment of particles that fall onto the substrate is prevented.

Nineteenth Embodiment

Figure 24:
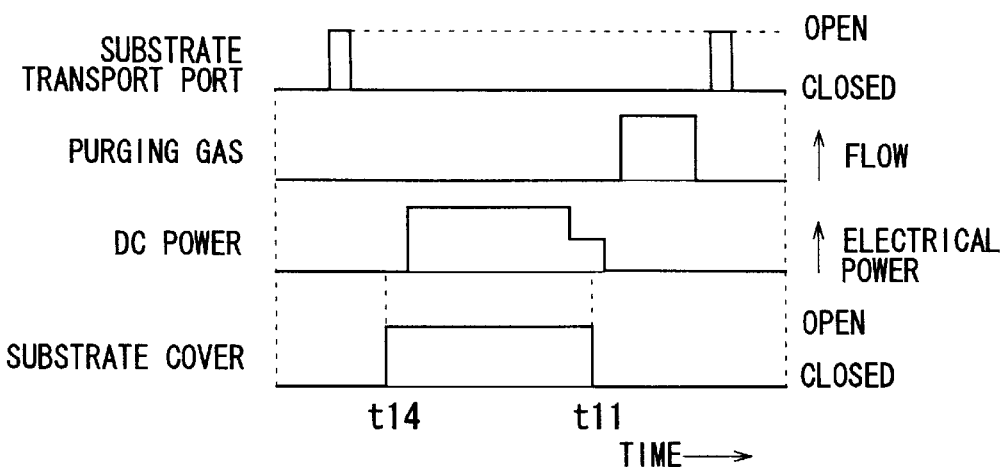
FIG. 24 is a drawing that shows the operational timing of a substrate cover in the nineteenth embodiment of the present invention.

The flow of cover operation timing in the nineteenth embodiment of the present invention is shown in FIG. 24.

At the time t14, immediately before the application of the DC voltage, the cover that covers the substrate 3000 is opened and, at time t11, immediately before the DC voltage is stopped, the cover is closed. By closing the cover when etching is not being performed, particles occurring because of peeling from the upper electrode 2200 or from the inside walls of the processing chamber 2000 are caught by the cover, thereby preventing the attachment of these particles to the substrate.

Furthermore, in addition to the above-noted configurations, it is possible to use a configuration in which a detection means is provided that detects that the cover 3600 has been placed in the closed condition, the result of the detection by this detection means being used to turn off the DC power supply 2400.

Twentieth Embodiment

Figure 25:
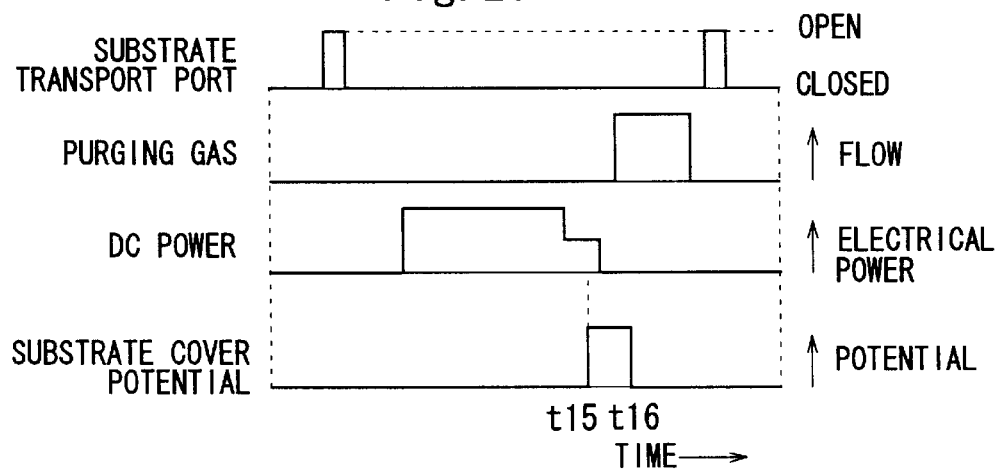
FIG. 25 is a drawing that shows the timing of the application of a potential to the substrate cover in the twentieth embodiment of the present invention.

The flow of cover operation timing in the twentieth embodiment of the present invention is shown in FIG. 25.

In addition to the seventeenth to the nineteenth embodiments, during the period of time from t15, immediately before the stopping of the application of the DC voltage, to the time t16, several seconds after the start of the introduction of the purging gas, a potential is imparted to the cover 3600. Particles that are generated immediately after the stopping of application of the DC voltage fall toward and are attracted to the cover 3600. Particles that are generated after the introduction of the purging gas follow the flow of the purging gas, and fall toward the exhaust port, so that they do not become attached to the substrate.

The material of the cover 3600 can be the same conductive material as the processing chamber 2100 inner wall, this being for example an aluminum alloy and, to reduce the number of particles that are generated, it can also have a metallic surface that is covered with aluminum oxide or silicon oxide.

Twenty-First Embodiment

Figure 26:
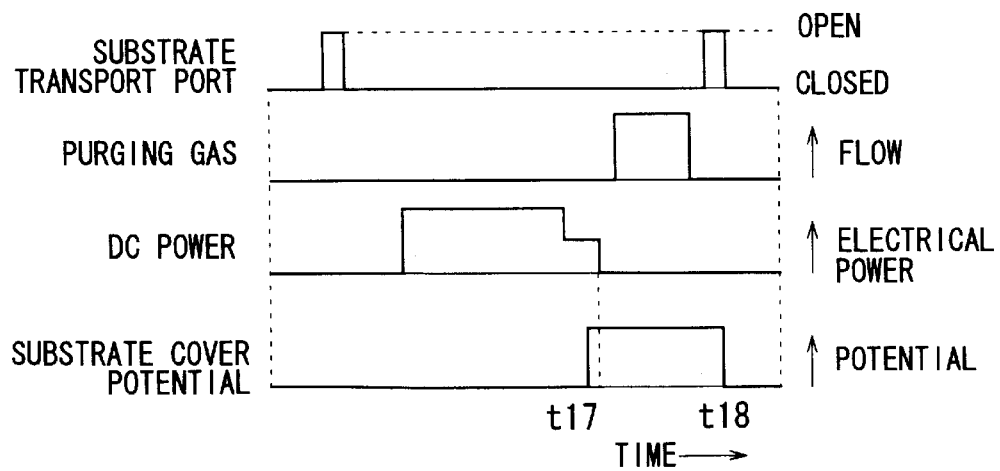
FIG. 26 is a drawing that shows the timing of the application of a potential to the substrate cover in the twenty-first embodiment of the present invention.

The flow of cover operation timing in the twenty-first embodiment of the present invention is shown in FIG. 26.

In the cases of the eighteenth and nineteenth embodiments of the present invention, as shown in FIG. 23 and FIG. 24, it is possible to impart a potential to the cover from the time t17, at which the application of the DC voltage is stopped, until time t18, at which point the processed substrate has been completely transported to outside the processing chamber. Particles that are generated in the period from the time immediately after the stopping of application of the DC voltage to the time the transporting port opens are collected by the cover, and therefore do not become attached to the substrate.

Twenty-Second Embodiment

Figure 27:
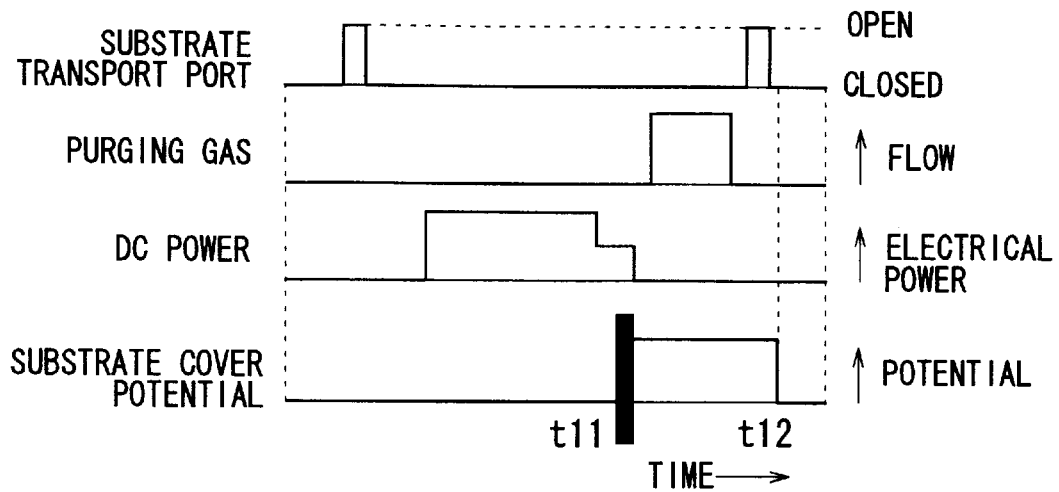
FIG. 27 is a drawing that shows the timing of the application of a potential to the substrate cover in the twenty-second embodiment of the present invention.

The flow of cover operation timing in the twenty-second embodiment of the present invention is shown in FIG. 27.

In the cases of the eighteenth and nineteenth embodiments of the present invention, as shown in FIG. 23 and FIG. 24, it is possible to impart a potential to the cover, from the time that the cover is started to be closed until the time the cover is opened. By making the cover 3600 the same potential as the lower processing electrode 2300 during the application of the DC voltage, there is no discharge between the substrate 3000 and the cover 3600, thereby enabling prevention of damage to the substrate and the generation of particles between the cover and the substrate.

Then, after the application of the DC voltage is stopped, the cover potential is either made equivalent to the self-bias potential, or a potential that has the same polarity as and an absolute value that is greater than the self-bias value.

It is also possible to apply this embodiment to the seventeenth embodiment.

Twenty-Third Embodiment

Figure 28:
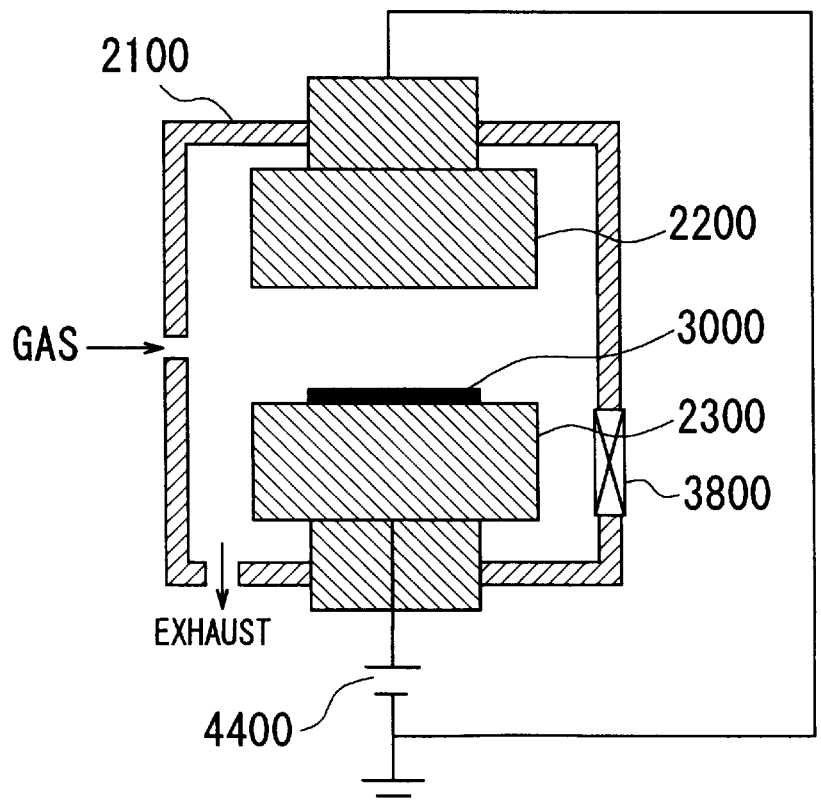
FIG. 28 is a cross-sectional view that shows the structure of a general DC plasma processing apparatus.

FIG. 28 shows one typical operating cycle of a DC plasma processing apparatus generally used in a semiconductor device plant.

Figure 29:
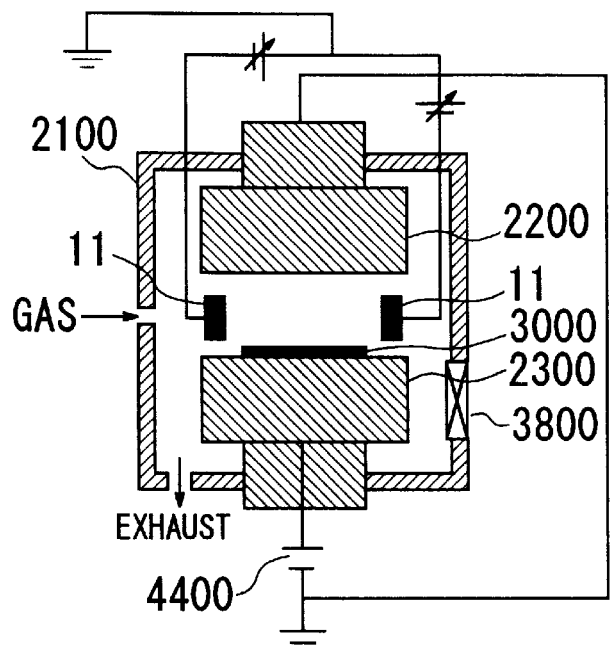
FIG. 29 is a drawing that shows the twenty-third embodiment of the present invention.

In the twenty-third embodiment of a DC plasma processing apparatus shown in FIG. 29, when the DC plasma processing is completed, it is known that the particles have a positive charge and, by making use of this phenomenon, by imparting a negative potential to an electrically conductive particle-removing electrode 11, particles are removed. As long as there is no influence on the DC plasma process, the particle-removing electrode 11 can be any shape such as that of a sheet or grid.

The large number of falling particles that are generated at the instant that the DC voltage is stopped are trapped by the particle-removing electrode 11, thereby preventing their reaching the substrate 3000.

Twenty-Fourth Embodiment

Figure 30:
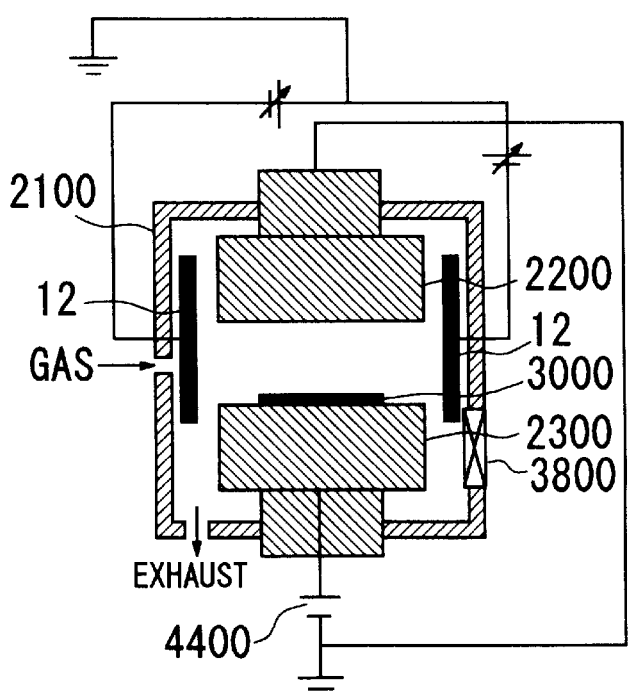
FIG. 30 is a drawing that shows the twenty-fourth embodiment of the present invention.

FIG. 30 shows a DC etching apparatus into which a function has been built to trap particles, using an attachment-prevention shield.

In a semiconductor device manufacturing apparatus, an attachment-prevention shield 12 is often used to prevent the attachment of sediments that occur during processing onto the chamber walls.

These attachment-prevention shields intentionally cause sediments to be deposited onto these attachment-prevention shields 12, and by replacing the attachment-prevention shields 12, it is possible to reduce the number of times the inside of the chamber needs to be cleaned.

The attachment-prevention shield 12 is often made of an electrically conductive metal, the attachment-prevention shield 12 being kept electrically insulated from the processing chamber, and when the etching is completed, a negative potential is imparted to the attachment-prevention shield 12.

The large number of positively charged falling particles that are generated at the instant that the DC voltage is stopped are pulled in by the negative potential on the attachment-prevention shield 12 and trapped and ultimately are trapped on the wall of the attachment-prevention shield 12, thereby preventing their reaching the substrate 3000.

Twenty-Fifth Embodiment

Figure 31:
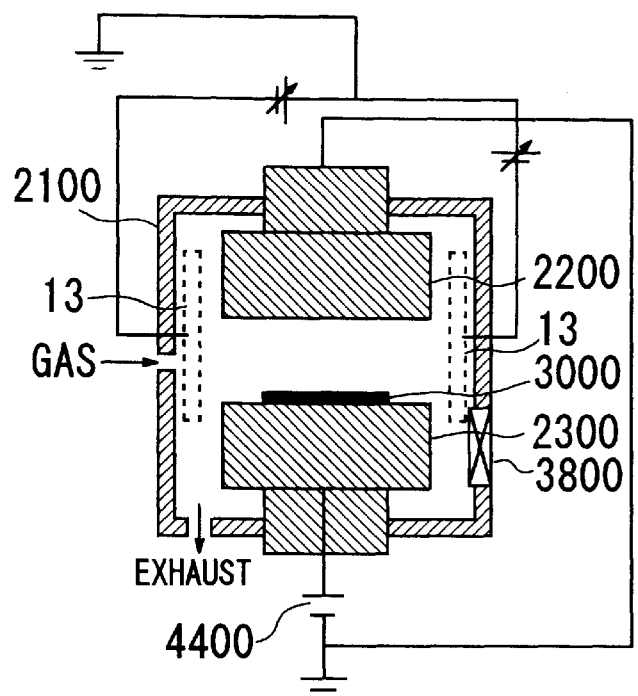
FIG. 31 is a drawing that shows the twenty-fifth embodiment of the present invention.

FIG. 31 shows an etching apparatus into which a function has built to trap particles, using an electrically conductive grid 13.

Specifically, the grid 13 is installed so that it is electrically insulated from the processing chamber and, when the etching is completed, a negative potential is imparted to the grid 13.

The large number of positively charged particles that fall when the DC voltage is stopped are pulled in by the negative potential of the grid 13, and are ultimately trapped by this grid 13, so that they are prevented from reaching the substrate.

Twenty-Sixth Embodiment

Figure 32:
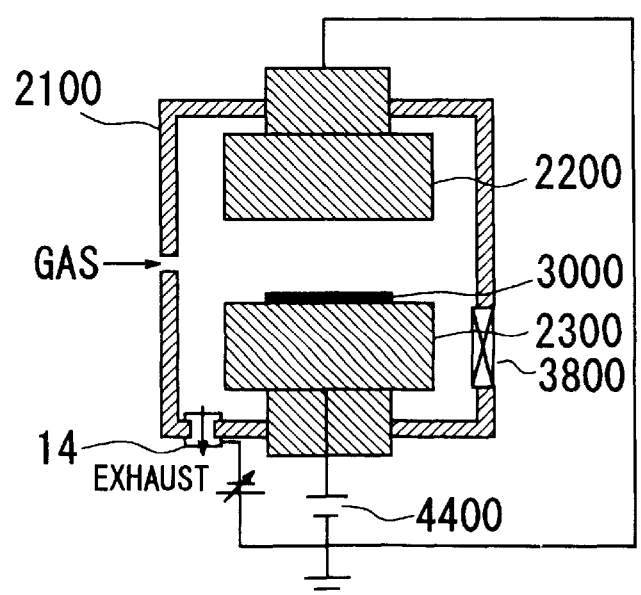
FIG. 32 is a drawing that shows the twenty-sixth embodiment of the present invention.

FIG. 32 shows a DC plasma processing apparatus in which a gas exhaust port 14 is formed at the bottom of the processing chamber and is electrically insulated from the chamber, thereby forcibly exhausting particles.

That is, in the above-noted particle-removing apparatus, when the DC plasma processing is completed, a negative potential is imparted to the exhaust port 14, the result being that the large number of positively charged particles that fall at the instant the DC voltage is stopped are pulled in toward the exhaust port 14, which has a negative potential, these particles being ultimately exhausted, so that they are prevented from reaching the substrate 3000.

Twenty-Seventh Embodiment

Figure 33:
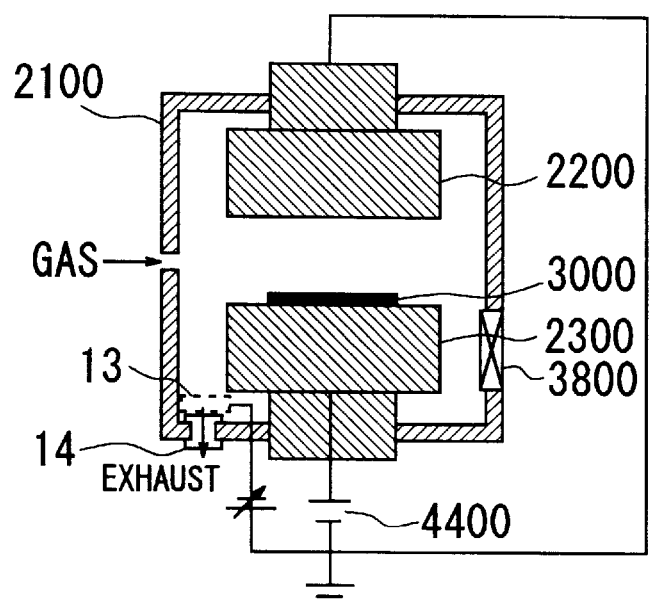
FIG. 33 is a drawing that shows the twenty-seventh embodiment of the present invention.

FIG. 33 shows an etching apparatus in which an electrically conductive grid 13 is provided in proximity to the gas exhaust port 14, this grid serving to trap particles.

Specifically, the grid 13 is installed in front of the exhaust port 14 so that it is electrically insulated with respect to the chamber, a negative potential being imparted to the grid 13 when DC plasma processing is completed.

The large number of positively charged particles that fall at the instant the DC voltage is stopped are pulled in toward the grid 13 because of its negative potential, and are ultimately trapped by the grid 13 or exhausted from the exhaust port 14, so that they are prevented from reaching the substrate 3000.

Twenty-Eighth Embodiment

Figure 34:
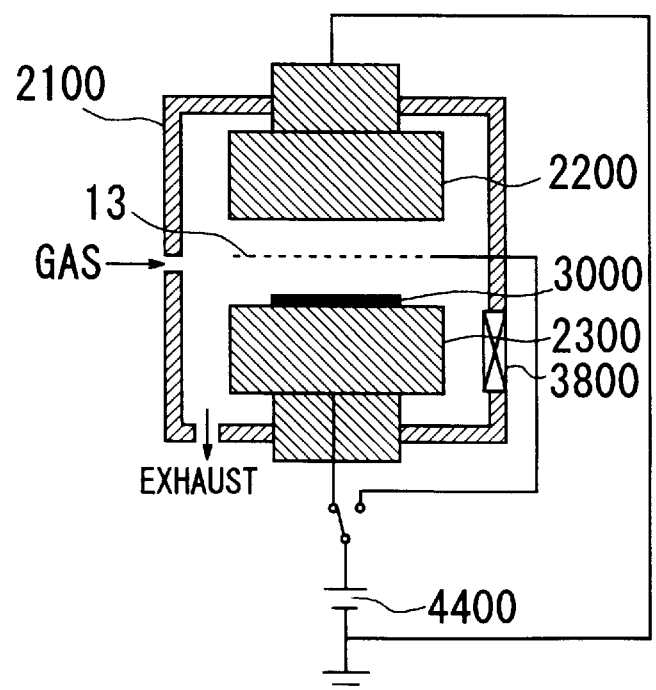
FIG. 34 is a drawing that shows the twenty-eight embodiment of the present invention.

FIG. 34 shows the twenty-eighth embodiment of the present invention.

In this embodiment, the electrically conductive grid 13 is installed between the upper electrode 2200 and the lower electrode 2300, and is placed in an electrically floating condition. By doing this, during the process, that is during discharge, the grid 13 tracks to the potential of the plasma, so that it is in the floating condition.

After the process is completed, the grid 13 is connected to a power supply 4400, and a discharge is caused between the grid 13 and the upper electrode 2200. When this is done, the power supply 4400 is not connected to the lower electrode 2300.

Then, in this condition, the semiconductor substrate 3000 is transported. By doing this, particles remain trapped between the upper electrode 2200 and the grid 13 and fly toward the area surrounding the plasma where they fall around the periphery thereof, so that they do not fall onto the substrate.

Twenty-Ninth Embodiment

Figure 35:
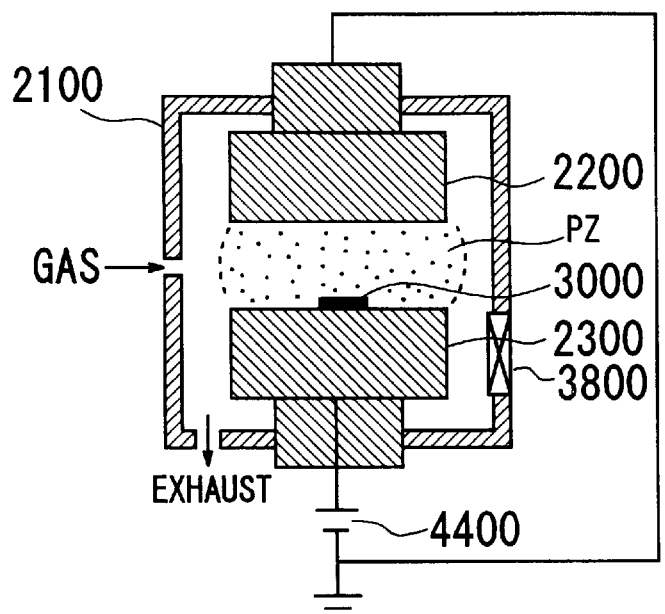
FIG. 35 is a drawing that shows the twenty-ninth embodiment of the present invention.

FIG. 35 shows the twenty-ninth embodiment of the present invention.

In this embodiment, a plasma PZ is generated that is sufficiently large with respect to the semiconductor substrate 3000. This plasma PZ is generated in accordance with the diameters of the upper electrode 2200 and the lower electrode 2300 and, in the case of FIG. 35, this is a plasma that is generated to considerably outside the substrate 3000.

By doing this, so that the plasma PZ extends greatly beyond the substrate 3000, particles drop along the outer periphery of the plasma PZ, thereby preventing them from falling onto the substrate 3000.

Thirtieth Embodiment

Figure 36:
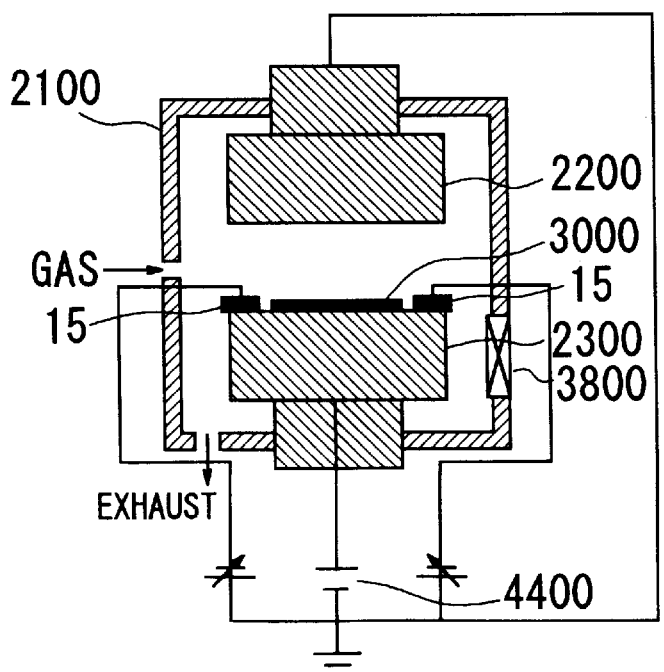
FIG. 36 is a drawing that shows the thirtieth embodiment of the present invention.

FIG. 36 shows the thirtieth embodiment of the present invention.

In this embodiment, a donut-shaped electrode 15 is installed over the lower electrode 2300 so as to surround the substrate 3000, a negative voltage being applied to the electrode 15.

The timing of the application of the above-noted voltage is the time that the process is completed and the time that the plasma power supply is turned off.

By doing the above, positively charged particles are guided to the electrode 15, thereby preventing them from falling onto the substrate 3000.

Thirty-First Embodiment

Figure 37:
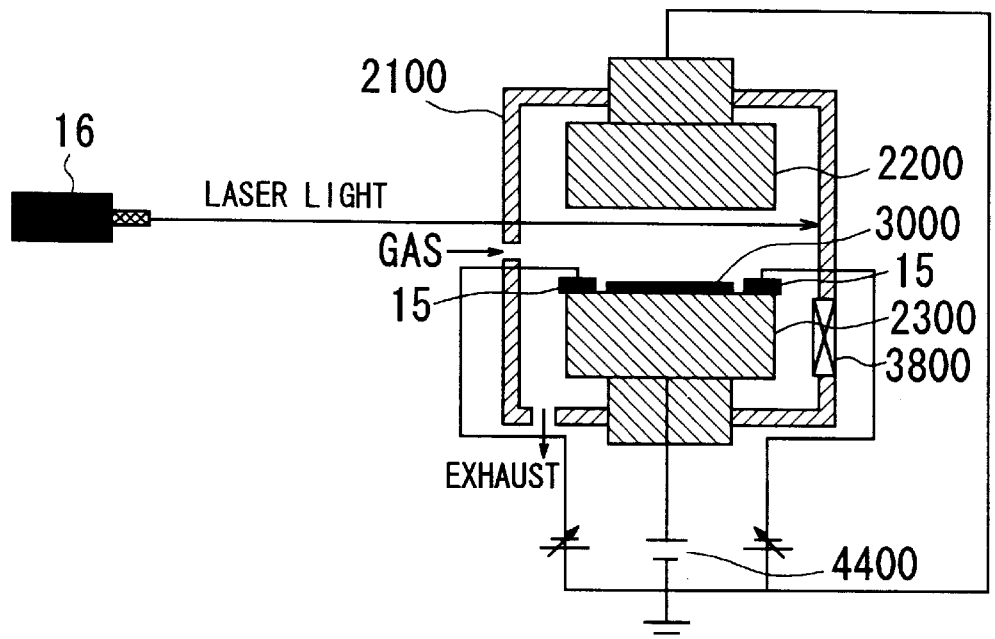
FIG. 37 is a drawing that shows the thirty-first embodiment of the present invention.

FIG. 37 shows the thirty-first embodiment of the present invention.

In this embodiment, a laser apparatus is introduced for the purpose of monitoring the generation of particles. The location at which the laser light is shined is the region under the upper electrode 2200. By adopting this configuration, it is possible to detect at an early stage particles that are trapped in the region near the plasma sheath.

Then, after the particles are detected, a negative voltage is applied to the electrode 15, so as to collect the particles, preventing them from falling onto the substrate 3000.

Thirty-Second Embodiment

Figure 38:
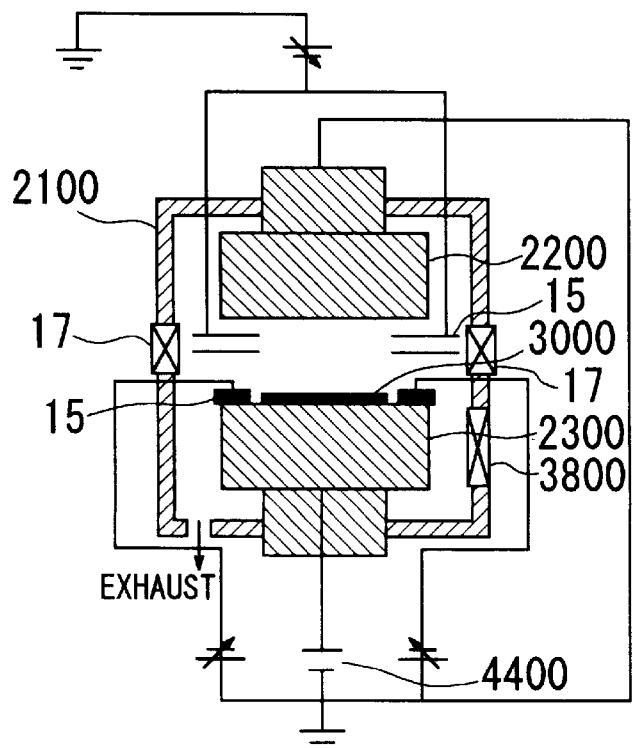
FIG. 38 is a drawing that shows the thirty-second embodiment of the present invention.

FIG. 38 shows the thirty-second embodiment of the present invention.

In this embodiment, gate valves 17 are installed on the side wall of the processing chamber near the upper electrode 2200, a vacuum pump or other such exhausting apparatus being connected to the outside thereof. An electrode 15 is installed in front of the gate valve 17, and a provision is also made to apply a negative voltage to this electrode 15.

When the processing is completed and the voltage applied to the lower electrode 2300, is cut off, a negative voltage is applied to the electrode 15. By doing this, particles are pulled toward the gate valve 17. When this occurs, the gate valve 17 is opened, so that the particles are exhausted, thereby preventing the particle from falling onto the substrate 3000.

As described in detail above, the present invention is capable of reducing the particles that become attached to a substrate, and is an invention that is based on the charged condition of the particles, enabling highly efficient prevention of attachment of particles.

What is claimed is:

1. A particle-removing apparatus in a semiconductor device manufacturing apparatus in which a high-frequency voltage is applied between an upper electrode and a lower electrode so as to generate a plasma within a processing chamber that processes a substrate located in said processing chamber, in which is provided a cover that covers said substrate, said substrate being covered by closing said cover, so as to prevent the attachment of particles within said processing chamber to said substrate, wherein said particle-removing apparatus comprising a first control means for controlling the timing of drive of said cover, said control means performing control so as to change said cover from an opened condition to a closed condition immediately before stopping the application of said high-frequency voltage.

2. A particle-removing apparatus according to claim 1, wherein control is performed so that said cover is changed from the closed condition to the open condition in synchronization with a transport operation of a substrate-transporting apparatus provided in said semiconductor device manufacturing apparatus.

3. A particle-removing apparatus according to claim 2, wherein the timing of the control of the change of said cover from the closed condition to the opened condition is immediately before a processed substrate is transported to outside said processing chamber.

4. A particle-removing apparatus according to claim 2, wherein the timing of the control of the change of said cover from the closed condition to the opened condition is immediately after said substrate is transported to outside said processing chamber.

5. A particle-removing apparatus according to claim 1, wherein the timing of the control of the change of said cover from the closed condition to the opened condition is immediately before application of said high-frequency voltage.

6. A particle-removing apparatus according to claim 1, wherein a potential is imparted to said cover, said particle-removing apparatus further comprising a second control means which performs control of the timing of imparting said potential to said cover, and said control means performing control so that the potential is imparted to the cover minimally from immediately before the stopping of application of the high-frequency voltage to several seconds after the starting of introduction of a purging gas.

7. A particle-removing apparatus according to claim 1, wherein a potential is imparted to said cover, said particle-removing apparatus further comprising a second control means which performs control of the timing of imparting said potential to said cover, and said control means performing control so that the potential is imparted to the cover minimally from immediately before the stopping of application of the high-frequency voltage until immediately before said purging gas is introduced.

8. A particle-removing apparatus according to claim 6, wherein said potential is imparted until the time at which said substrate is transported to outside said processing chamber.

9. A particle-removing apparatus according to claim 6, wherein said potential is selected from a group consisting of a voltage that is equivalent to a self-bias voltage that appears on said lower electrode and a voltage that has the same polarity as said self-bias voltage and an absolute value that is larger than said self-bias voltage.

10. A particle-removing apparatus according to claim 6, wherein said potential is equivalent to the potential on said lower electrode.

11. A particle-removing method in a semiconductor device manufacturing apparatus in which a high-frequency voltage is applied so as to generate a plasma within a processing chamber that processes a substrate located in said processing chamber, in which is provided a cover that covers said substrate, said substrate being covered by closing said cover, so as to prevent the attachment of particles within said processing chamber to said substrate, wherein said particle-removing method comprising a first step of controlling said cover from the opened condition to the closed condition immediately before stopping the application of said high-frequency voltage.

12. A particle-removing method according to claim 11, further comprising a second step of controlling said cover so as to change from said closed condition to said open condition in synchronization with a transport operation of a substrate transporting apparatus that is provided in said semiconductor device manufacturing apparatus.

13. A particle-removing method in a semiconductor device manufacturing apparatus in which a high-frequency voltage is applied so as to generate a plasma within a processing chamber that processes a substrate located in said processing chamber, in which is provided a cover that covers said substrate, said substrate being covered by closing said cover, so as to prevent the attachment of particles within said processing chamber to said substrate, said particle-removing method comprising:

a first step of changing said cover from the opened condition to the closed condition;

a second step of stopping the application of said high-frequency voltage immediately after said cover is placed in the closed condition; and a third step of imparting a potential to said cover.

* * * * *